(12) United States Patent
Cornfeld et al.

(10) Patent No.: US 11,961,931 B2
(45) Date of Patent: Apr. 16, 2024

(54) INVERTED METAMORPHIC MULTIJUNCTION SOLAR CELLS HAVING A PERMANENT SUPPORTING SUBSTRATE

(71) Applicant: SOLAERO TECHNOLOGIES CORP., Albuquerque, NM (US)

(72) Inventors: Arthur B. Cornfeld, Sandy Springs, GA (US); Jeff Steinfeldt, Rio Rancho, NM (US)

(73) Assignee: SolAero Technologies Corp, Albuquerque, NM (US)

( * ) Notice: Subject to any disclaimer, the term of this patent is extended or adjusted under 35 U.S.C. 154(b) by 36 days.

(21) Appl. No.: 17/820,509

(22) Filed: Aug. 17, 2022

(65) Prior Publication Data

US 2022/0393056 A1 Dec. 8, 2022

Related U.S. Application Data

(60) Continuation of application No. 16/897,558, filed on Jun. 10, 2020, now Pat. No. 11,424,381, which is a
(Continued)

(51) Int. Cl.
*H01L 31/0725* (2012.01)
*H01L 31/0304* (2006.01)
(Continued)

(52) U.S. Cl.
CPC ...... *H01L 31/0725* (2013.01); *H01L 31/0304* (2013.01); *H01L 31/03046* (2013.01);
(Continued)

(58) Field of Classification Search
CPC ............... H01L 31/0725; H01L 31/184; H01L 31/1848; H01L 31/1856; H01L 31/1844; H01L 31/06875; H01L 31/03046; H01L 31/0304; H01L 31/048; H01L 31/1892; H01L 31/644; H01L 31/50
See application file for complete search history.

(56) References Cited

U.S. PATENT DOCUMENTS

| | | |
|---|---|---|
| 3,488,834 A | 1/1970 | Baird |
| 3,964,155 A | 6/1976 | Leinkram et al. |

(Continued)

FOREIGN PATENT DOCUMENTS

| | | |
|---|---|---|
| EP | 1 109 230 | 6/2001 |
| EP | 1 863 099 | 12/2007 |

(Continued)

OTHER PUBLICATIONS

U.S. Appl. No. 12/265,113, filed Nov. 5, 2008, Varghese.
(Continued)

*Primary Examiner* — Jayne L Mershon

(57) ABSTRACT

A method of manufacturing a solar cell that includes providing a semiconductor growth substrate; depositing on said growth substrate a sequence of layers of semiconductor material forming a solar cell; applying a metal contact layer over said sequence of layers; affixing the adhesive polyimide surface of a permanent supporting substrate directly over said metal contact layer and permanently bonding it thereto by a thermocompressive technique; and removing the semiconductor growth substrate.

16 Claims, 43 Drawing Sheets

Related U.S. Application Data division of application No. 15/988,465, filed on May 24, 2018, now abandoned, which is a division of application No. 14/674,627, filed on Mar. 31, 2015, now Pat. No. 10,008,623, which is a division of application No. 13/547,334, filed on Jul. 12, 2012, now Pat. No. 9,018,519, which is a continuation-in-part of application No. 12/401,189, filed on Mar. 10, 2009, now abandoned.

(51) Int. Cl.
*H01L 31/048* (2014.01)
*H01L 31/0687* (2012.01)
*H01L 31/18* (2006.01)

(52) U.S. Cl.
CPC ...... *H01L 31/03048* (2013.01); *H01L 31/048* (2013.01); *H01L 31/06875* (2013.01); *H01L 31/184* (2013.01); *H01L 31/1844* (2013.01); *H01L 31/1848* (2013.01); *H01L 31/1856* (2013.01); *H01L 31/1892* (2013.01); *Y02E 10/544* (2013.01); *Y02P 70/50* (2015.11)

(56) References Cited

U.S. PATENT DOCUMENTS

| | | | |
|---|---|---|---|
| 4,001,864 A | 1/1977 | Gibbons et al. | |
| 4,255,211 A | 3/1981 | Fraas | |
| 4,338,480 A | 7/1982 | Antypas et al. | |
| 4,369,730 A | 1/1983 | Izu et al. | |
| 4,393,576 A | 7/1983 | Dahlberg | |
| 4,612,408 A | 9/1986 | Moddel et al. | |
| 4,881,979 A | 11/1989 | Lewis | |
| 4,963,949 A * | 10/1990 | Wanlass | H01L 21/02543 |
| | | | 257/E29.081 |
| 5,019,177 A | 5/1991 | Wanlass | |
| 5,021,360 A | 6/1991 | Melman et al. | |
| 5,053,083 A | 10/1991 | Sinton et al. | |
| 5,217,539 A | 6/1993 | Fraas et al. | |
| 5,322,572 A | 6/1994 | Wanlass et al. | |
| 5,342,453 A | 8/1994 | Olson | |
| 5,376,185 A | 12/1994 | Wanlass | |
| 5,479,032 A | 12/1995 | Forrest et al. | |
| 5,510,272 A | 4/1996 | Morikawa et al. | |
| 5,538,902 A | 7/1996 | Izu et al. | |
| 5,882,956 A * | 3/1999 | Umehara | H01L 24/83 |
| | | | 438/464 |
| 5,944,913 A | 8/1999 | Hou et al. | |
| 6,165,873 A | 12/2000 | Hamada | |
| 6,180,432 B1 | 1/2001 | Freeouf | |
| 6,239,354 B1 | 5/2001 | Wanlass et al. | |
| 6,252,287 B1 | 6/2001 | Kurtz et al. | |
| 6,281,426 B1 | 8/2001 | Olson et al. | |
| 6,300,557 B1 | 10/2001 | Wanlass et al. | |
| 6,300,558 B1 | 10/2001 | Takamoto et al. | |
| 6,340,788 B1 | 1/2002 | King et al. | |
| 6,482,672 B1 | 11/2002 | Hoffman et al. | |
| 6,660,928 B1 | 12/2003 | Patton et al. | |
| 6,690,041 B2 | 2/2004 | Armstrong et al. | |
| 6,794,631 B2 | 9/2004 | Clark | |
| 6,815,736 B2 | 11/2004 | Mascarenhas | |
| 6,951,819 B2 | 10/2005 | Iies et al. | |
| 7,071,407 B2 | 7/2006 | Fatemi et al. | |
| 7,122,734 B2 | 10/2006 | Fetzer et al. | |
| 7,166,520 B1 | 1/2007 | Henley | |
| 7,727,795 B2 | 6/2010 | Stan | |
| 7,741,146 B2 | 6/2010 | Cornfeld | |
| 7,785,989 B2 | 8/2010 | Sharps | |
| 7,842,881 B2 | 11/2010 | Cornfeld | |
| 7,846,759 B2 | 12/2010 | Atwater, Jr. et al. | |
| 7,960,201 B2 | 6/2011 | Cornfeld et al. | |
| 8,039,291 B2 | 10/2011 | Cornfeld et al. | |
| 8,067,687 B2 | 11/2011 | Wanlass | |
| 8,187,907 B1 | 5/2012 | Newman | |
| 8,227,689 B2 | 7/2012 | King et al. | |
| 8,236,600 B2 | 8/2012 | Cornfeld | |
| 8,263,853 B2 | 9/2012 | Varghese | |
| 8,263,856 B2 | 9/2012 | Cornfeld et al. | |
| 8,378,281 B2 | 2/2013 | Kats et al. | |
| 2002/0117675 A1 | 8/2002 | Mascarenhas | |
| 2003/0226952 A1 | 12/2003 | Clark | |
| 2004/0079408 A1 | 4/2004 | Fetzer et al. | |
| 2004/0166681 A1 * | 8/2004 | Iles | H01L 31/1892 |
| | | | 438/689 |
| 2004/0200523 A1 | 10/2004 | King et al. | |
| 2005/0133086 A1 | 6/2005 | Itoyama et al. | |
| 2005/0211291 A1 | 9/2005 | Bianchi | |
| 2005/0274411 A1 * | 12/2005 | King | H01L 31/0687 |
| | | | 136/262 |
| 2006/0021565 A1 | 2/2006 | Zahler et al. | |
| 2006/0112986 A1 | 6/2006 | Atwater, Jr. et al. | |
| 2006/0144435 A1 | 7/2006 | Wanlass et al. | |
| 2006/0162768 A1 | 7/2006 | Wanlass et al. | |
| 2006/0185582 A1 | 8/2006 | Atwater, Jr. et al. | |
| 2007/0137694 A1 | 6/2007 | Foster et al. | |
| 2007/0218649 A1 | 9/2007 | Hernandez | |
| 2007/0277873 A1 | 12/2007 | Cornfeld et al. | |
| 2008/0029151 A1 | 2/2008 | McGlynn | |
| 2008/0149173 A1 | 6/2008 | Sharps | |
| 2008/0185038 A1 | 8/2008 | Sharps | |
| 2008/0245409 A1 | 10/2008 | Varghese et al. | |
| 2009/0038679 A1 | 2/2009 | Varghese et al. | |
| 2009/0078308 A1 | 3/2009 | Varghese | |
| 2009/0078309 A1 | 3/2009 | Stan | |
| 2009/0078310 A1 | 3/2009 | Stan | |
| 2009/0078311 A1 | 3/2009 | Stan | |
| 2009/0155952 A1 | 6/2009 | Stan | |
| 2009/0188546 A1 | 7/2009 | McGlynn | |
| 2009/0223554 A1 | 9/2009 | Sharps | |
| 2009/0229658 A1 | 9/2009 | Stan | |
| 2009/0229662 A1 | 9/2009 | Stan | |
| 2009/0272430 A1 | 11/2009 | Cornfeld | |
| 2009/0272438 A1 | 11/2009 | Cornfeld | |
| 2009/0288703 A1 | 11/2009 | Stan | |
| 2009/0314348 A1 | 12/2009 | McGlynn | |
| 2010/0012174 A1 | 1/2010 | Varghese | |
| 2010/0012175 A1 | 1/2010 | Varghese | |
| 2010/0031994 A1 | 2/2010 | Varghese | |
| 2010/0047959 A1 | 2/2010 | Cornfeld | |
| 2010/0093127 A1 | 4/2010 | Sharps | |
| 2010/0116327 A1 | 5/2010 | Cornfeld | |
| 2010/0122724 A1 | 5/2010 | Cornfeld | |
| 2010/0122764 A1 | 5/2010 | Newman | |
| 2010/0147366 A1 | 6/2010 | Stan | |
| 2010/0186804 A1 | 7/2010 | Cornfeld | |
| 2010/0200063 A1 * | 8/2010 | Djeu | H01L 31/044 |
| | | | 257/E31.117 |
| 2010/0203730 A1 | 8/2010 | Cornfeld | |
| 2010/0206365 A1 | 8/2010 | Chumney | |
| 2010/0229913 A1 | 9/2010 | Cornfeld | |
| 2010/0229926 A1 | 9/2010 | Newman | |
| 2010/0229932 A1 | 9/2010 | Cornfeld | |
| 2010/0229933 A1 | 9/2010 | Cornfeld | |
| 2010/0233838 A1 | 9/2010 | Varghese | |
| 2010/0233839 A1 | 9/2010 | Cornfeld | |
| 2010/0236615 A1 | 9/2010 | Sharps | |
| 2010/0248411 A1 | 9/2010 | Cornfeld | |
| 2010/0282288 A1 | 11/2010 | Cornfeld | |
| 2011/0030774 A1 | 2/2011 | Cornfeld | |
| 2011/0041898 A1 | 2/2011 | Cornfeld | |
| 2011/0272027 A1 | 11/2011 | Lomasney | |

FOREIGN PATENT DOCUMENTS

| | | |
|---|---|---|
| EP | 0 658 944 | 4/2009 |
| FR | 2 878 076 | 5/2006 |
| WO | WO 2005/015638 | 2/2005 |

OTHER PUBLICATIONS

U.S. Appl. No. 12/708,361, filed Feb. 18, 2010, Cornfeld.
U.S. Appl. No. 12/716,814, filed Mar. 3, 2010, Cornfeld.

(56) References Cited

OTHER PUBLICATIONS

U.S. Appl. No. 12/730,018, filed Mar. 23, 2010, Cornfeld.
U.S. Appl. No. 12/756,926, filed Apr. 8, 2010, Cornfeld.
U.S. Appl. No. 12/775,946, filed May 7, 2010, Newman.
U.S. Appl. No. 12/813,408, filed Jun. 10, 2010, Patel.
U.S. Appl. No. 12/844,673, filed Jul. 27, 2010, Stan.
Aiken et al. Consideration of High Bandgap Subcells for Advanced Multijunction Solar Cells, Conference Record of the 2006 IEEE 4th World Conference on Photovoltaic Energy Conversion, May 1, 2006, pp. 838-841.
Cornfeld, et al., Advances in the Performance of Inverted Metamorphic Multi-junction Solar Cells. 23m European Photovoltaic Energy Conference, Sep. 1-5, 2008, Valencia, Spain.
Cornfeld, et al., Development of a Large Area Inverted Metamorphic Multi-junction Highly Efficient AMO Solar Cell. Conference paper presented at the 33m IEEE Photovoltaic Specialists Conference (May 11-16, 2008) on May 12, 2008. San Diego, CA. 17 pages.
European Search Report, Application No. EP 08 01 3466, dated Dec. 18, 2009. European Patent Office, Berlin, Germany.
Friedman, et al., 0.7-eV GaInAs Junction for a GaInP/GaAs/GaInAs(1eV)/GaInAs(0.7eV) Four-Junction Solar Cell. 2006 IEEE 4th World Conference on Photovoltaic Energy Conversion, May 7-12, 2006, Waikoloa, HI.
Geisz, et al., High-efficiency GaInP/GaAs/InGaAs triple-junction solar cells grown inverted with a metamorphic bottom junction. Applied Physics Letters 91, 023502 (2007), pp. 023502-1-023502-3. Online publication Jul. 10, 2007. American Institute of Physics, Melville, NY.
Geisz, et al., Inverted GaInP / (In)GaAs / InGaAs Triple-Junction Solar Cells with Low-Stress Metamorphic Bottom Junctions. 33m IEEE Photovoltaic Specialists Conference, May 11-16, 2008, San Diego, CA.
King, et al., High-Efficiency Space and Terrestrial Multijunction Solar Cells Through Bandgap Control in Cell Structures. 2002 Photovoltaic Specialists Conference, Conference Record of the 29th IEEE, May 19-24, 2002, pp. 776-781. New Orleans, LA.
King, et al., Next-Generation, High-Efficiency 11I-V Multijunction Solar Cells. 28th IEEE Photovoltaic Specialists Conference, Sep. 15-22, 2000, Anchorage, AK.
Lewis et al., Recent Developments in Multijunction Solar Cell Research, Solar Cells, 1988; 24:171-183.
Lewis et al., The Crystallographic Connection of MOCVD-Grown Monolithic Cascade Subcells via Transparent Graded Layers, Journal of Crystal Growth, 1984; 69:515-526.
Partial European Search Report, Application No. EP 08 01 3466, dated Feb. 12, 2009, European Patent Office, Berlin, Germany.
Schultz et al. High Efficiency 1.0 eV GaIn As Bottom Solar Cell for 3-junction Monolithic Stack, Conference Record of the Twenty First IEEE Photovoltaic Specialists Conference. Kissimmee, Florida; May 21-25, 1990. Kissimmee, FL. New York: The Institute of Electrical and Electronics Engineers, Inc., pp. 148-152.

Sexl, M., et al., MBE Growth of Metamorphic In(Ga)AlAs Buffers. 1997 IEEE International Symposium on Compound Semiconductors. Sep. 1997, pp. 49-52. IEEE, Piscataway, NJ.
Sharps, et al., Inverting the triple junction improves efficiency and flexibility. Compound Semiconductor. Oct. 2007, pp. 25-28. IOP Publishing, Ltd., Bristol, England.
Sinharoy, et al., Progress in the Development of Metamorphic Multi-junction 11I-V Space Solar Cells. Progress in Photovoltaics: Research and Applications, vol. 10, Feb. 2002, pp. 427-432, John Wiley & Sons, Ltd. Hoboken, NJ.
Stan, et al., Very High Efficiency Triple Junction Solar Cells by MOVPE. 14th International Conference of Metalorganic Vapor Phase Epitaxy. Jun. 1-6, 2008, Metz, France.
Stan, M., et al., High-efficiency quadruple junction solar cells using OMVPE with inverted metamorphic device structures. Journal of Crystal Growth 312 (2010), pp. 1370-1374. Elsevier, Amsterdam, Netherlands.
Takamoto, et al., Future Development of InGaP/(In)GaAs Based Multijunction Solar Cells. Proceedings of the 315 IEEE PVSC, Jan. 3-7, 2005, pp. 519-524. Lake Buena Vista, FL.
Takamoto, T., et al., InGaP/GaAs-based Multijunction Solar Cells. Progress in Photovoltaics: Research and Applications, 2005; vol. 13, pp. 495-511. Wiley InterScience, John Wiley & Sons, Ltd., Hoboken, NJ.
Venkatasubramanian, et al., An Inverted-Growth Approach to Development of an IR-Transparent, High-Efficiency AlGaAs/GaAs Cascade Solar Cell. 22nd IEEE Photovoltaic Specialists Conference, Oct. 7-11, 1991, Las Vegas, NV.
Venkatasubramanian, et al., High-quality eutectic-metal-bonded AlGaAs—GaAs thin films on Si substrates. Applied Physics Letters, vol. 60, No. 7, pp. 886-888. Feb. 17, 1992. American Institute of Physics, Melville, NY.
Wanlass et al., Lattice-Mismatched Approaches for High-Performance, III-V Photovoltaic Energy Converters. Proceedings of the 31st IEEE PVSC, Jan. 3-7, 2005, Lake Buena Vista, FL.
Wanlass et al., Monolithic, Ultra-Thin GaInP/GaAs/GaInAs Tandem Solar Cells. 2006 IEEE 4th World Conference on Photovoltaic Energy Conversion, May 7-12, 2006, Waikoloa, HI.
Wurfel. Physics of Solar Cells: from Basic Principles to Advanced Concepts. 2nd, Updated and Expanded Edition. 2009. Sections 6.4, 6.5 and 6.8. 20 pages. Wiley-VCH, Weinheim, Germany.
Yamaguchi, Physics and Technologies of Superhigh-Efficiency Tandem Solar Cells. Semiconductors, vol. 33, No. 9, Sep. 1999, pp. 961-964. Toyota Technological Institute, Nagoya, Japan. © 1999, American Institute of Physics.
Yoon, et al., Progress of Inverted Metamorphic III-V Solar Cell Development at Spectrolab. 33r<1 IEEE Photovoltaic Specialists Conference, May 11-16, 2008, San Diego, CA.
U.S. Appl. No. 16/897,558, filed Jun. 10, 2020.
U.S. Appl. No. 15/988,465, filed May 24, 2018.
U.S. Appl. No. 14/674,627, filed Mar. 31, 2015.
U.S. Appl. No. 13/547,334, filed Jul. 12, 2012.
U.S. Appl. No. 12/401,189, filed Mar. 10, 2009.

* cited by examiner

INVERTED METAMORPHIC MULTIJUNCTION SOLAR CELLS HAVING A PERMANENT SUPPORTING SUBSTRATE

REFERENCE TO RELATED APPLICATIONS

This application is a continuation of U.S. patent application Ser. No. 16/897,558 filed Jun. 10, 2020, which was a divisional of U.S. patent application Ser. No. 15/988,465 filed on May 24, 2018, which was a divisional of Ser. No. 14/674,627, filed Mar. 31, 2015, now U.S. Pat. No. 10,008,623 which in turn was a divisional of U.S. patent application Ser. No. 13/547,334, filed Jul. 12, 2012, now U.S. Pat. No. 9,018,519, which in turn was a continuation-in-part of U.S. patent application Ser. No. 12/401,189, filed Mar. 10, 2009.

This application is related to U.S. patent application Ser. No. 13/440,331 filed Apr. 15, 2012.

This application is related to U.S. patent application Ser. No. 13/401,181 filed Feb. 21, 2012.

This application is related to U.S. patent application Ser. No. 12/844,673 filed Jul. 27, 2010.

This application is related to U.S. patent application Ser. No. 12/813,408 filed Jun. 10, 2010.

This application is related to U.S. patent application Ser. No. 12/775,946 filed May 7, 2010, now U.S. Pat. No. 8,187,907.

This application is related to U.S. patent application Ser. No. 12/756,926, filed Apr. 8, 2010.

This application is related to U.S. patent application Ser. No. 12/730,018, filed Mar. 23, 2010.

This application is related to U.S. patent application Ser. No. 12/716,814, filed Mar. 3, 2010, now U.S. Pat. No. 9,018,521.

This application is related to U.S. patent application Ser. No. 12/708,361, filed Feb. 18, 2010.

This application is related to U.S. patent application Ser. No. 12/637,241, filed Dec. 14, 2009.

This application is related to U.S. patent application Ser. No. 12/623,134, filed Nov. 20, 2009 now U.S. Pat. No. 8,378,281.

This application is related to U.S. patent application Ser. No. 12/544,001, filed Aug. 19, 2009.

This application is related to U.S. patent application Ser. Nos. 12/401,137, 12/401,157, and 12/401,189, filed Mar. 10, 2009.

This application is related to U.S. patent application Ser. No. 12/362,201, now U.S. Pat. No. 7,960,201; Ser. No. 12/362,213; and Ser. No. 12/362,225, filed Jan. 29, 2009.

This application is related to U.S. patent application Ser. No. 12/337,014 filed Dec. 17, 2008, now U.S. Pat. No. 7,785,989, and Ser. No. 12/337,043 filed Dec. 17, 2008.

This application is related to U.S. patent application Ser. No. 12/271,127 and Ser. No. 12/271,192 filed Nov. 14, 2008.

This application is related to U.S. patent application Ser. No. 12/267,812 filed Nov. 10, 2008 now U.S. Pat. No. 8,236,600.

This application is related to U.S. patent application Ser. No. 12/190,449, filed Aug. 12, 2008, now U.S. Pat. No. 7,741,146, and its divisional patent application Ser. No. 12/816,205, filed Jun. 15, 2010, now U.S. Pat. No. 8,039,291.

This application is related to U.S. patent application Ser. No. 12/187,477, filed Aug. 7, 2008 now U.S. Pat. No. 8,263,853.

This application is related to U.S. patent application Ser. No. 12/218,558 and U.S. patent application Ser. No. 12/218,582 filed Jul. 16, 2008.

This application is related to U.S. patent application Ser. No. 12/123,864 filed May 20, 2008.

This application is related to U.S. patent application Ser. No. 12/023,772, filed Jan. 31, 2008.

This application is related to U.S. patent application Ser. No. 11/956,069, filed Dec. 13, 2007, and its divisional application Ser. No. 12/187,454 filed Aug. 7, 2008, now U.S. Pat. No. 7,727,795.

This application is also related to U.S. patent application Ser. Nos. 11/860,142 and 11/860,183 filed Sep. 24, 2007.

This application is also related to U.S. patent application Ser. No. 11/445,793 filed Jun. 2, 2006 now U.S. Pat. No. 8,536,445.

This application is also related to U.S. patent application Ser. No. 11/500,053 filed Aug. 7, 2006, and its divisional application Ser. No. 12/417,367 filed Apr. 2, 2009 now U.S. Pat. No. 8,513,518.

All of the above applications are hereby incorporated by reference in their entirety.

GOVERNMENT RIGHTS STATEMENT

This invention was made with government support under, inter alia, Contract No. FA9453-06-C-0345 awarded by the U.S. Air Force. The Government has certain rights in the invention.

BACKGROUND OF THE INVENTION

Field of the Invention

The present invention relates to the field of semiconductor devices, and to fabrication processes and devices such as multijunction solar cells based on III-V semiconductor compounds including a metamorphic layer. Such devices are also known as inverted metamorphic multijunction solar cells.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, Ill-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31st IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties, particularly relating to the most appropriate choice of materials and fabrication steps.

SUMMARY OF THE INVENTION

Briefly, and in general terms, the present invention provides a method of manufacturing a solar cell comprising: providing a growth substrate; depositing on said growth substrate a sequence of layers of semiconductor material forming a solar cell; providing a glass surrogate substrate; bonding an adhesive polyimide layer to the glass surrogate substrate; adjoining the surface of the adhesive polyimide layer of the glass surrogate substrate to the surface of the sequence of layers of semiconductor material forming a solar cell and permanently bonding it thereto by a thermocompressive technique; and removing the semiconductor substrate.

In another aspect, the present invention provides a method of manufacturing a solar cell comprising: providing a semiconductor growth substrate; depositing on said growth substrate a sequence of layers of semiconductor material forming a solar cell; applying a metal contact layer over said sequence of layers; affixing the adhesive polyimide surface of a permanent supporting substrate directly over said metal contact layer and permanently bonding it thereto by a thermocompressive technique; and removing the semiconductor growth substrate.

As used herein, a "temporary adhesive" is an adhesive in which the temporarily bonded layers can be readily separated upon treatment of the temporary adhesive with an organic solvent under conditions that do not damage the semiconductor material. Such conditions typically soften or dissolve the temporary adhesive. In contrast, a "permanent adhesive" as used herein, is an adhesive in which the permanently bonded layers cannot be readily separated upon treatment of the permanent adhesive with a solvent under typical processing conditions for separation of temporarily bonded layers without damaging the semiconductor material.

Some implementations of the present invention may incorporate or implement fewer of the aspects and features noted in the foregoing summaries.

Additional aspects, advantages, and novel features of the present invention will become apparent to those skilled in the art from this disclosure, including the following detailed description as well as by practice of the invention. While the invention is described below with reference to illustrative embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

BRIEF DESCRIPTION OF THE DRAWING

The invention will be better and more fully appreciated by reference to the following detailed description when considered in conjunction with the accompanying drawings, wherein.

DESCRIPTION OF ILLUSTRATIVE EMBODIMENTS

Figure 1:
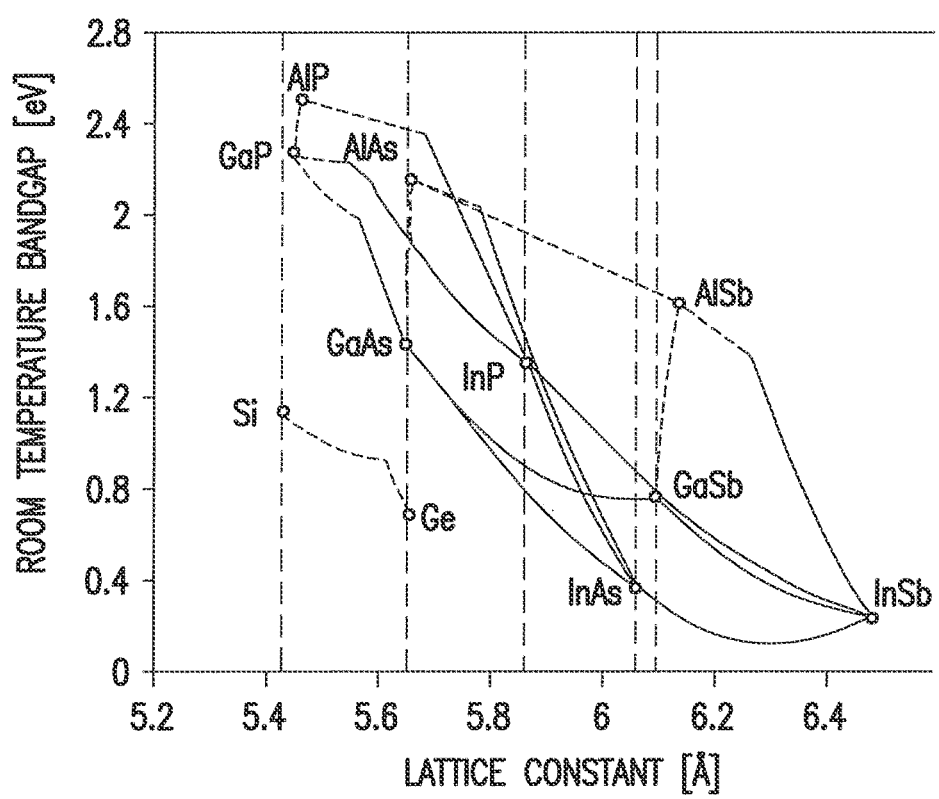
FIG. 1 is a graph representing the band gap of certain binary materials and their lattice constants.

Details of the present invention will now be described including exemplary aspects and embodiments thereof.

Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multi junction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are initially grown epitaxially directly on a semiconductor growth substrate, such as for example GaAs or Ge, and such subcells are consequently lattice matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice mismatched with respect to the growth substrate and such that the at least one lower subcell has a third lower band gap (i.e., a band gap in the range of 0.7 to 1.2 eV). A surrogate substrate or support structure is then attached or provided over the "bottom" or substantially lattice mismatched lower subcell, and the growth semiconductor substrate is subsequently removed. (The growth substrate may then subsequently be re-used for the growth of a second and subsequent solar cells).

A variety of different features and aspects of inverted metamorphic multi junction solar cells are disclosed in the related applications noted above. Some or all of such features may be included in the structures and processes associated with the solar cells of the present invention.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 2:
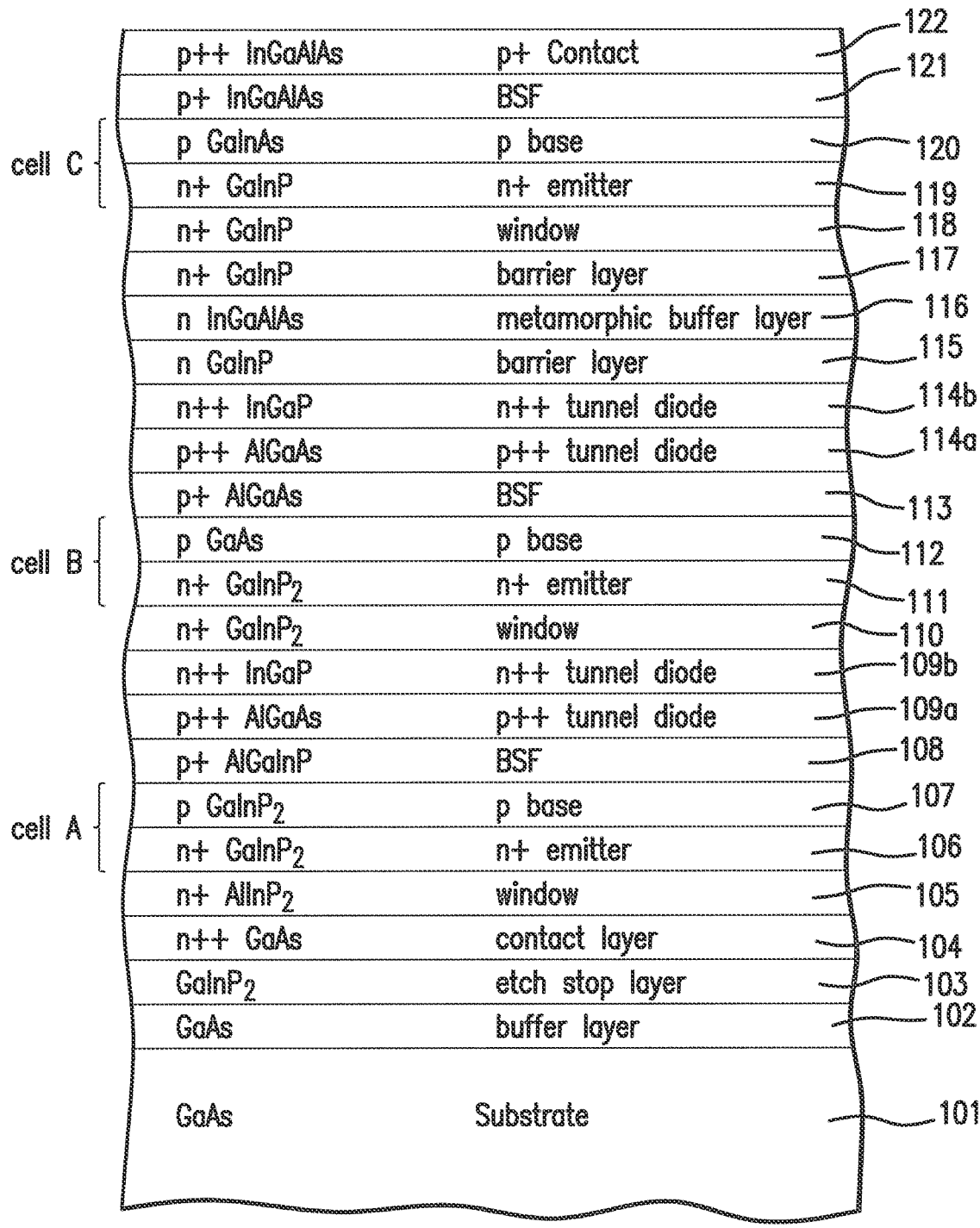
FIG. 2 is a cross-sectional view of the solar cell of the invention after the deposition of semiconductor layers on the growth substrate.

FIG. 2 depicts the multi junction solar cell according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15.degree. off-cut substrate, that is to say, its surface is orientated 15.degree. off the (100) plane towards the (111)A plane, as more fully described in U.S. Patent Application Pub. No. 2009/0229662 A1 (Stan et al.). Other alternative growth substrates, such as described in U.S. Pat. No. 7,785,989 (Sharps et al.), may be used as well.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of a GaAs substrate, the buffer layer 102 is preferably GaAs. In the case of a Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally lattice matched to the growth substrate 101.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (Tl). The group IV includes carbon (C), silicon (Si), germanium (Ge), and tin (Sn). The group V includes nitrogen (N), phosphorus (P), arsenic (As), antimony (Sb), and bismuth (Bi).

In one embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 16.

Subcell A will ultimately become the "top" subcell of the inverted metamorphic structure after completion of the process steps according to the present invention to be described hereinafter.

On top of the base layer 107 a back surface field ("BSF") layer 108 preferably p+ AlGaInP is deposited and used to reduce recombination loss.

The BSF layer 108 drives minority carriers from the region near the base/BSF interface surface to minimize the effect of recombination loss. In other words, the BSF layer 108 reduces recombination loss at the backside of the solar subcell A and thereby reduces the recombination in the base.

On top of the BSF layer 108 is deposited a sequence of heavily doped p-type and n-type layers 109a and 109b that form a tunnel diode, i.e. an ohmic circuit element that connects subcell A to subcell B. Layer 109a is preferably composed of p++ AlGaAs, and layer 109b is preferably composed of n++ InGaP.

On top of the tunnel diode layers 109 a window layer 110 is deposited, preferably n+ InGaP. The advantage of utilizing InGaP as the material constituent of the window layer 110 is that it has an index of refraction that closely matches the adjacent emitter layer 111, as more fully described in U.S. Patent Application Pub. No. 2009/0272430 A1 (Cornfeld et al.). More generally, the window layer 110 used in the subcell B operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 16.

In previously disclosed implementations of an inverted metamorphic solar cell, the middle cell was a homostructure. In the present invention, similarly to the structure disclosed in U.S. Patent Application Pub. No. 2009/0078310 A1 (Stan et al.), the middle subcell becomes a heterostructure with an InGaP emitter and its window is converted from InAlP to InGaP. This modification eliminated the refractive index discontinuity at the window/emitter interface of the middle subcell. Moreover, the window layer 110 is preferably doped more than that of the emitter 111 to move the Fermi level up closer to the conduction band and therefore create band bending at the window/emitter interface which results in constraining the minority carriers to the emitter layer.

In one embodiment of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the emitters of middle subcell B nor the bottom subcell C will be exposed to absorbable radiation. Substantially all of the photons representing absorbable radiation will be absorbed in the bases of cells B and C, which have narrower band gaps than the emitters. Therefore, the advantages of using heterojunction subcells are: (i) the short wavelength response for both subcells will improve, and (ii) the bulk of the radiation is more effectively absorbed and collected in the narrower band gap base. The effect will be to increase the short circuit current $J_{sc}$.

On top of the cell B is deposited a BSF layer 113 which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. The layer 114a is preferably composed of p++Al GaAs, and layer 114b is preferably composed of n++ InGaP.

A barrier layer 115, preferably composed of n-type InGa(Al)P, is deposited over the tunnel diode 114a/114b, to a thickness of about 1.0 micron. Such barrier layer is intended to prevent threading dislocations from propagating, either opposite to the direction of growth into the middle and top subcells B and A, or in the direction of growth into the bottom subcell C, and is more particularly described in copending U.S. Patent Application Pub. No. 2009/0078309 A1 (Cornfeld et al.).

A metamorphic layer (or graded interlayer) 116 is deposited over the barrier layer 115 using a surfactant. Layer 116 is preferably a compositionally step-graded series of InGaAlAs layers, preferably with monotonically changing lattice constant, so as to achieve a gradual transition in lattice constant in the semiconductor structure from subcell B to subcell C while minimizing threading dislocations from occurring. The band gap of layer 116 is constant throughout its thickness, preferably approximately equal to 1.5 eV, or otherwise consistent with a value slightly greater than the band gap of the middle subcell B. One embodiment of the graded interlayer may also be expressed as being composed of $(In_xGa_{1-x})_yAl_{1-y}As$, wherein $0<x<1$ and $0<y<1$ with x and y selected such that the band gap of the interlayer remains constant at approximately 1.50 eV or other appropriate band gap.

In the surfactant assisted growth of the metamorphic layer 116, a suitable chemical element is introduced into the reactor during the growth of layer 116 to improve the surface characteristics of the layer. In one embodiment, such element may be a dopant or donor atom such as selenium (Se) or tellurium (Te). Small amounts of Se or Te are therefore incorporated in the metamorphic layer 116, and remain in the finished solar cell. Although Se or Te are exemplary n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic surfactants one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 116.

In an alternative embodiment where the solar cell has only two subcells, and the "middle" cell B is the uppermost or top subcell in the final solar cell, wherein the "top" subcell B would typically have a band gap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different band gap. In one embodiment of the present invention, the layer 116 is composed of a plurality of layers of InGaAlAs, with monotonically changing lattice constant, each layer having the same band gap, approximately 1.5 eV.

The advantage of utilizing a constant band gap material such as InGaAlAs is that arsenide-based semiconductor material is much easier to process in standard commercial MOCVD reactors, while the small amount of aluminum assures radiation transparency of the metamorphic layers.

Although one embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a band gap energy greater than that of the second solar cell.

In another embodiment of the present invention, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In one embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n+ type InGaAs and p-type InGaAs, respectively, or n+ type InGaP and p-type InGaAs for a heterojunction subcell, although other suitable materials consistent with lattice constant and band gap requirements may be used as well. Thus, for example, the upper subcell may be composed of an GaInP, GaAs, GaInAs, GaAsSb, or GaInAsN emitter region and an GaInP, GaAs, GaInAs, GaAsSb, or GaInAsN base region. The doping profile of layers 119 and 120 will be discussed in connection with FIG. 16.

A BSF layer 121, preferably composed of InGaAlAs, is then deposited on top of the cell C, the BSF layer performing the same function as the BSF layers 108 and 113.

Finally a high band gap contact layer 122, preferably composed of InGaAlAs, is deposited on the BSF layer 121.

This contact layer added to the bottom (non-illuminated) side of a lower band gap photovoltaic cell, in a single or a multi junction photovoltaic cell, can be formulated to reduce absorption of the light that passes through the cell, so that (1) an ohmic metal contact layer below (non-illuminated side) it will also act as a mirror layer, and (2) the contact layer doesn't have to be selectively etched off, to prevent absorption.

It should be apparent to one skilled in the art, that additional layer(s) may be added or deleted in the cell structure without departing from the scope of the present invention.

Figure 3:
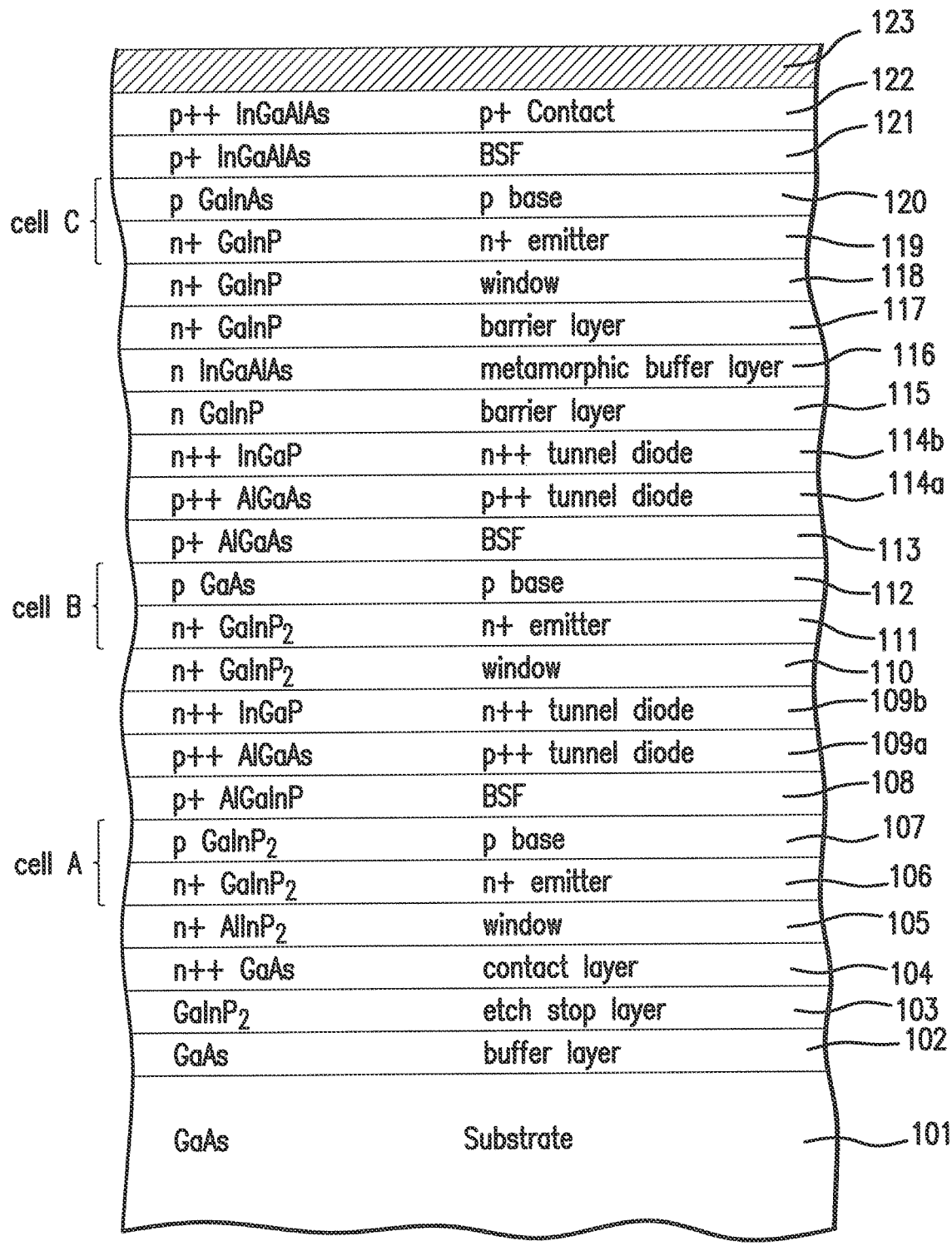
FIG. 3 is a cross-sectional view of the solar cell of FIG. 2 after the next process step.

FIG. 3 is a cross-sectional view of the solar cell of FIG. 2 after the next process step in which a metal contact layer 123 is deposited over the p+ semiconductor contact layer 122. The metal is preferably the sequence of metal layers Ti/Au/Ag/Au or Ti/Pd/Ag, although other suitable sequences and materials may be used as well.

Also, the metal contact scheme chosen is one that has a planar interface with the semiconductor, after heat treatment to activate the ohmic contact. This is done so that (i) a dielectric layer separating the metal from the semiconductor doesn't have to be deposited and selectively etched in the metal contact areas; and (ii) the contact layer is specularly reflective over the wavelength range of interest.

Figure 4A:
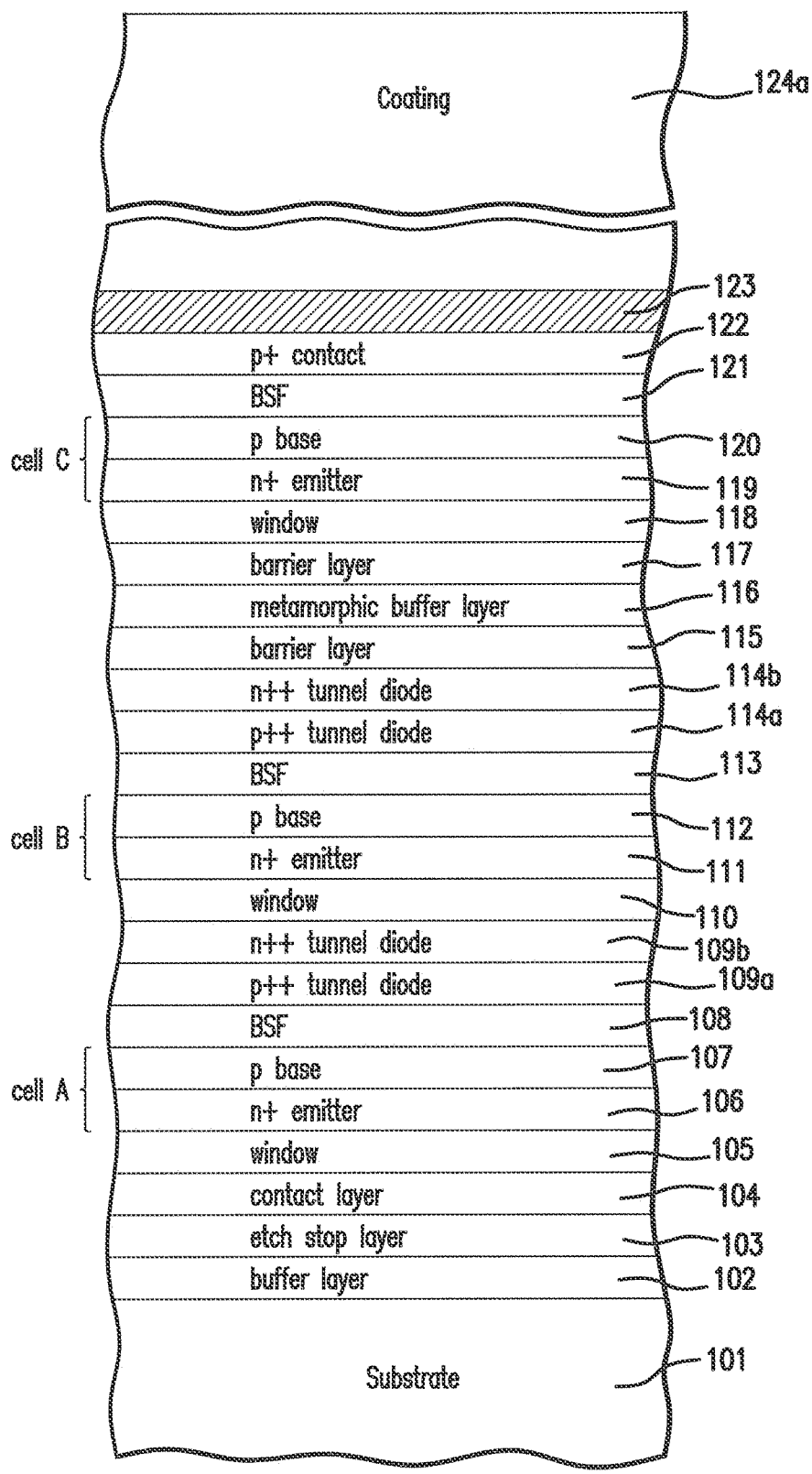
FIG. 4A is a cross-sectional view of the solar cell of FIG. 3 after the next process step.

FIG. 4A is a cross-sectional view of the solar cell of the FIG. 3 after the next process step in which a coating layer 124a is applied over the metal layer 123. The coating layer may be a polymer or polyimide composition, an epoxy based photoresist material, or other suitable material, and is preferably applied by spinning-on, spraying, or brushing. The coating layer 124a is preferably applied to a thickness of at least that of the epitaxial layers of the solar cell (typically around 12 microns), but in one embodiment preferably around 20 to 25 microns. Following the deposition step, and depending upon the specific composition of the coating material, the coating layer or film 124a is then cured, such as by the sequence of steps: thermally curing by a soft bake, near UV exposure (350-400 nm), post exposure bake and a hard bake at the anneal temperature (205.degree. C.). Following the curing process, the completely cross linked film is inert to all subsequent fabrication chemical and thermal steps.

Figure 4B:
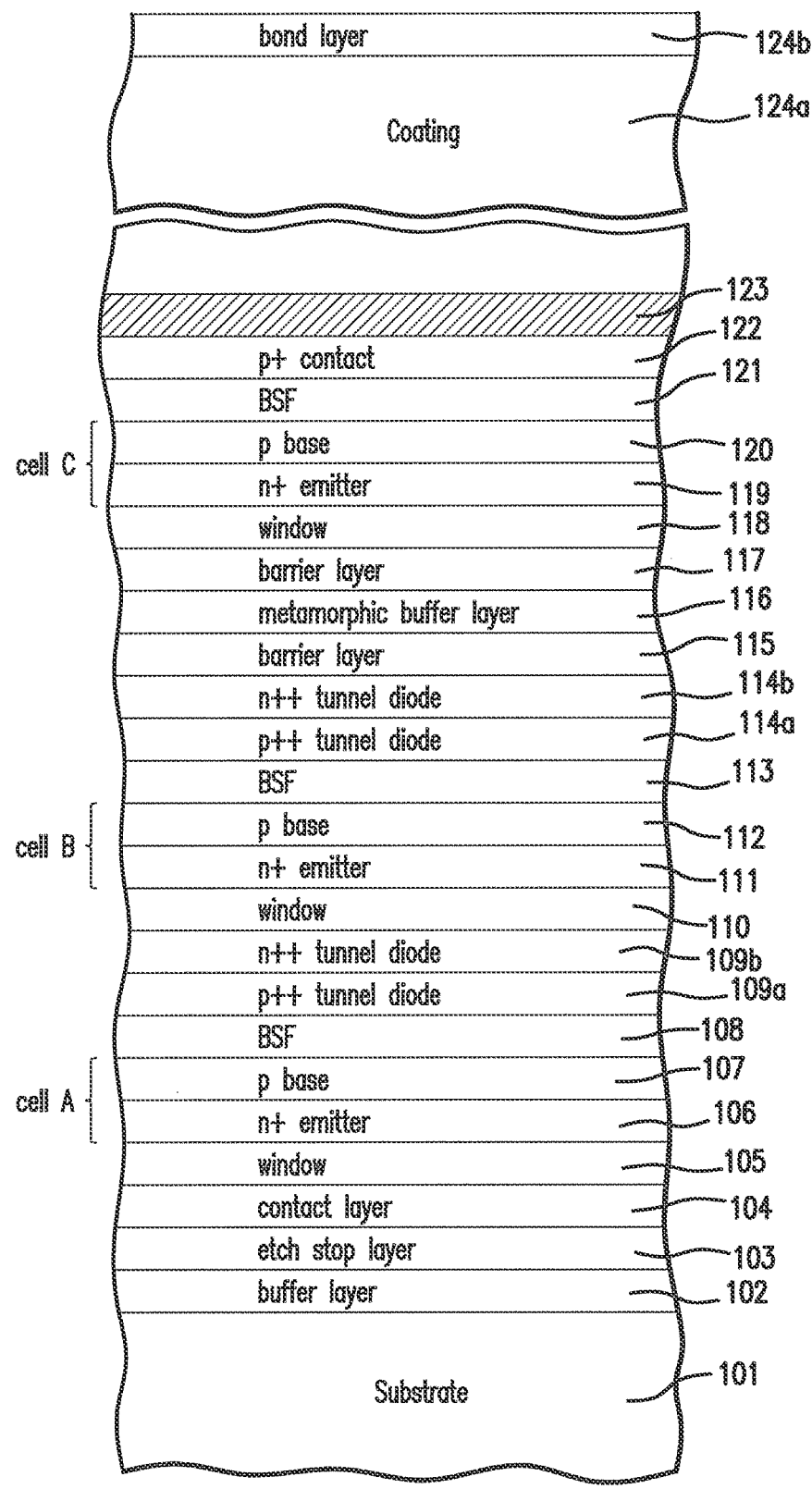
FIG. 4B is a cross-sectional view of the solar cell of FIG. 4A after the next process step.

FIG. 4B is a cross-sectional view of the solar cell of FIG. 4A after the next process step in which a bonding layer 124b is deposited over the coating layer 124a. In one embodiment of the present invention, the bonding layer is an adhesive, preferably Wafer Bond (manufactured by Brewer Science, Inc. of Rolla, Mo.), although other suitable bonding materials may be used.

Figure 4C:
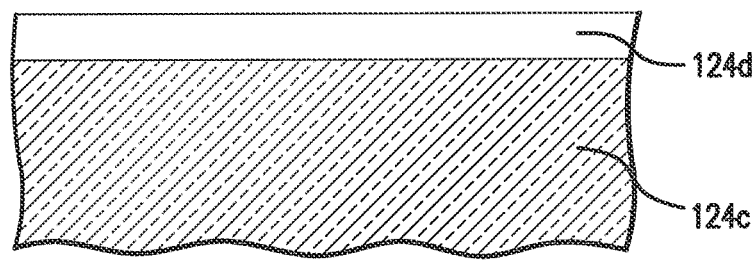
FIG. 4C is a cross-sectional view of another embodiment of the invention with a glass surrogate substrate having an adhesive polyimide layer bonded thereto.
Figure 5A:
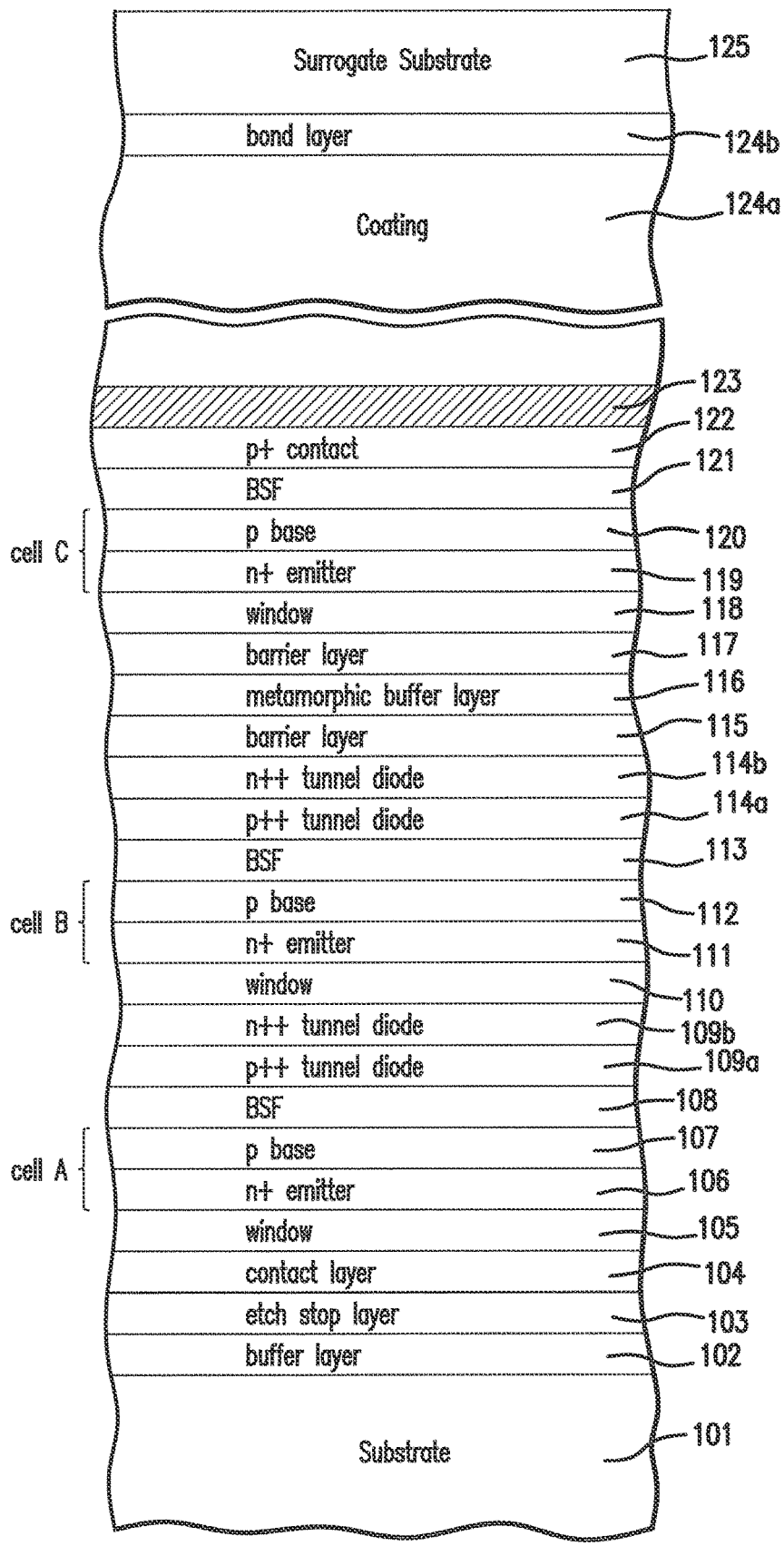
FIG. 5A is a cross-sectional view of the solar cell of FIG. 4B after the next process step in which a surrogate substrate is attached.

FIG. 5A is a cross-sectional view of the solar cell of FIG. 4 after the next process step in which a surrogate substrate 125, preferably sapphire, is attached. Alternatively, the surrogate substrate may be GaAs, Ge or Si, or other suitable material. The surrogate substrate is about 40 mils in thickness, and in the case of embodiments in which the surrogate substrate is to be removed, it is perforated with holes about 1 mm in diameter, spaced 4 mm apart, to aid in subsequent removal of the adhesive and the substrate.

Figure 5B:
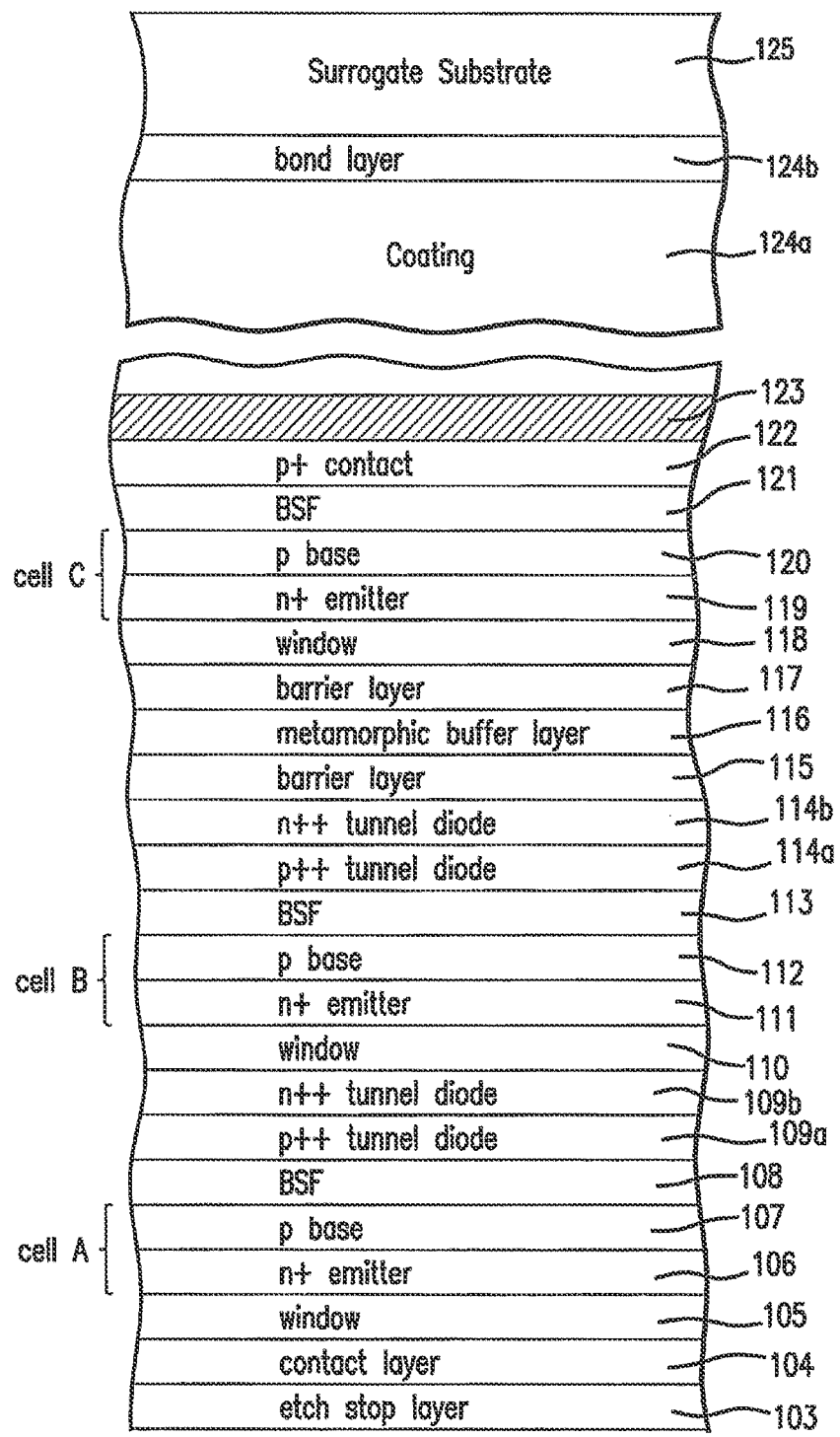
FIG. 5B is a cross-sectional view of the solar cell of FIG. 5A after the next process step in which the original substrate is removed.

FIG. 5B is a cross-sectional view of the solar cell of FIG. 5A after the next process step in which the original substrate is removed by a sequence of lapping, grinding and/or etching steps in which the substrate 101, and the buffer layer 102 are removed. The choice of a particular etchant is growth substrate dependent. In some embodiments, the substrate 101 may be removed by an epitaxial lift-off process, such as described in U.S. Patent Application Pub. No. 2010/0203730 A1 (Cornfeld et al.), and hereby incorporated by reference.

Figure 5C:
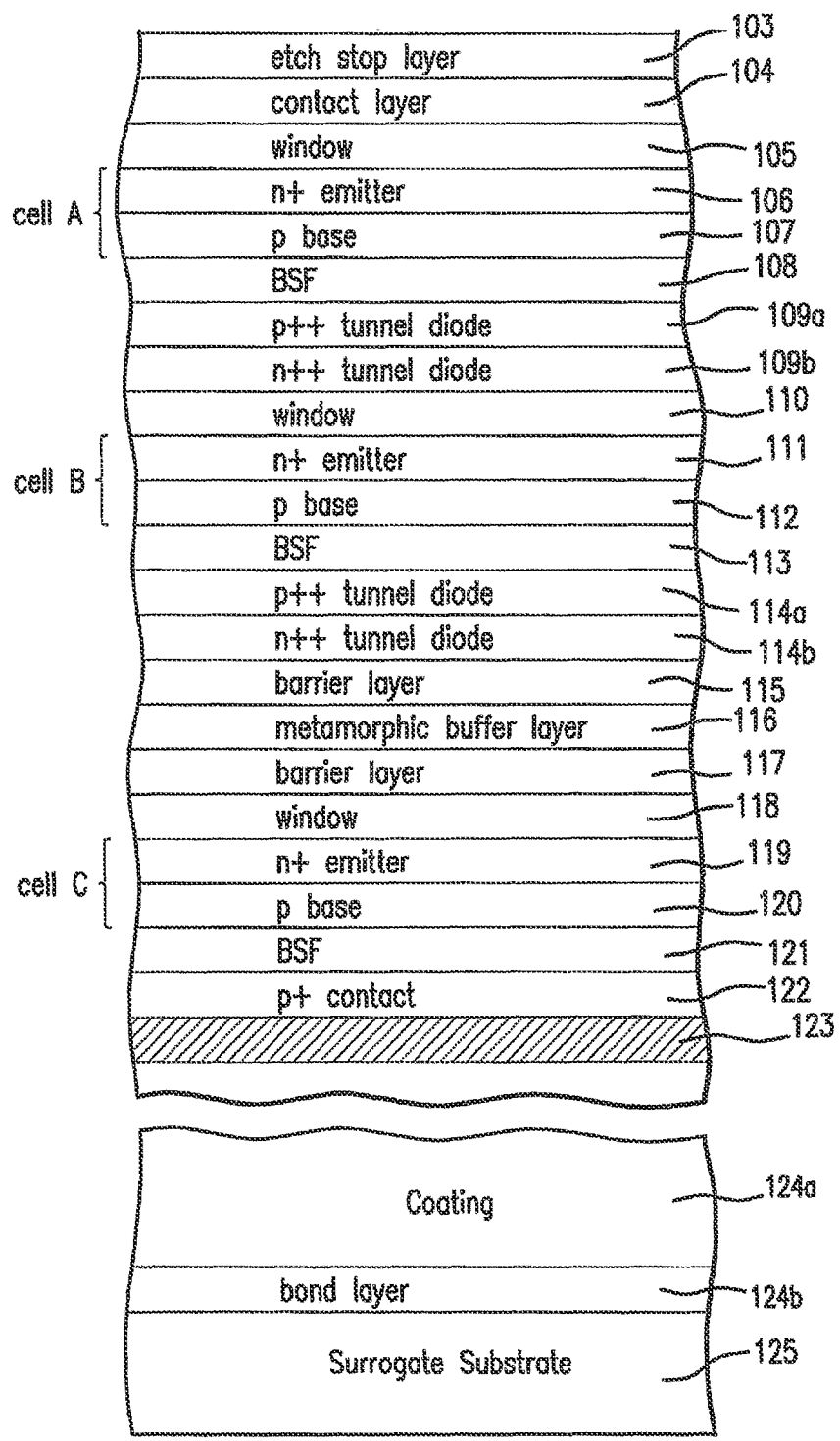
FIG. 5C is another cross-sectional view of the solar cell of FIG. 5B with the surrogate substrate on the bottom of the Figure.

FIG. 5C is a cross-sectional view of the solar cell of FIG. 5B with the orientation with the surrogate substrate 125 being at the bottom of the Figure. Subsequent Figures in this embodiment will assume such orientation.

FIG. 4C is a cross-sectional view of another embodiment of the invention that comprises a permanent supporting substrate. In the embodiment pictured in FIG. 4C, an adhesive polyimide layer 124d is bonded to a glass surrogate substrate 124c. The adhesive polyimide layer can be bonded to the permanent glass surrogate substrate at, for example, a curing temperature above 350 degrees C. The surrogate substrate can be about 40 mils in thickness.

Figure 5D:
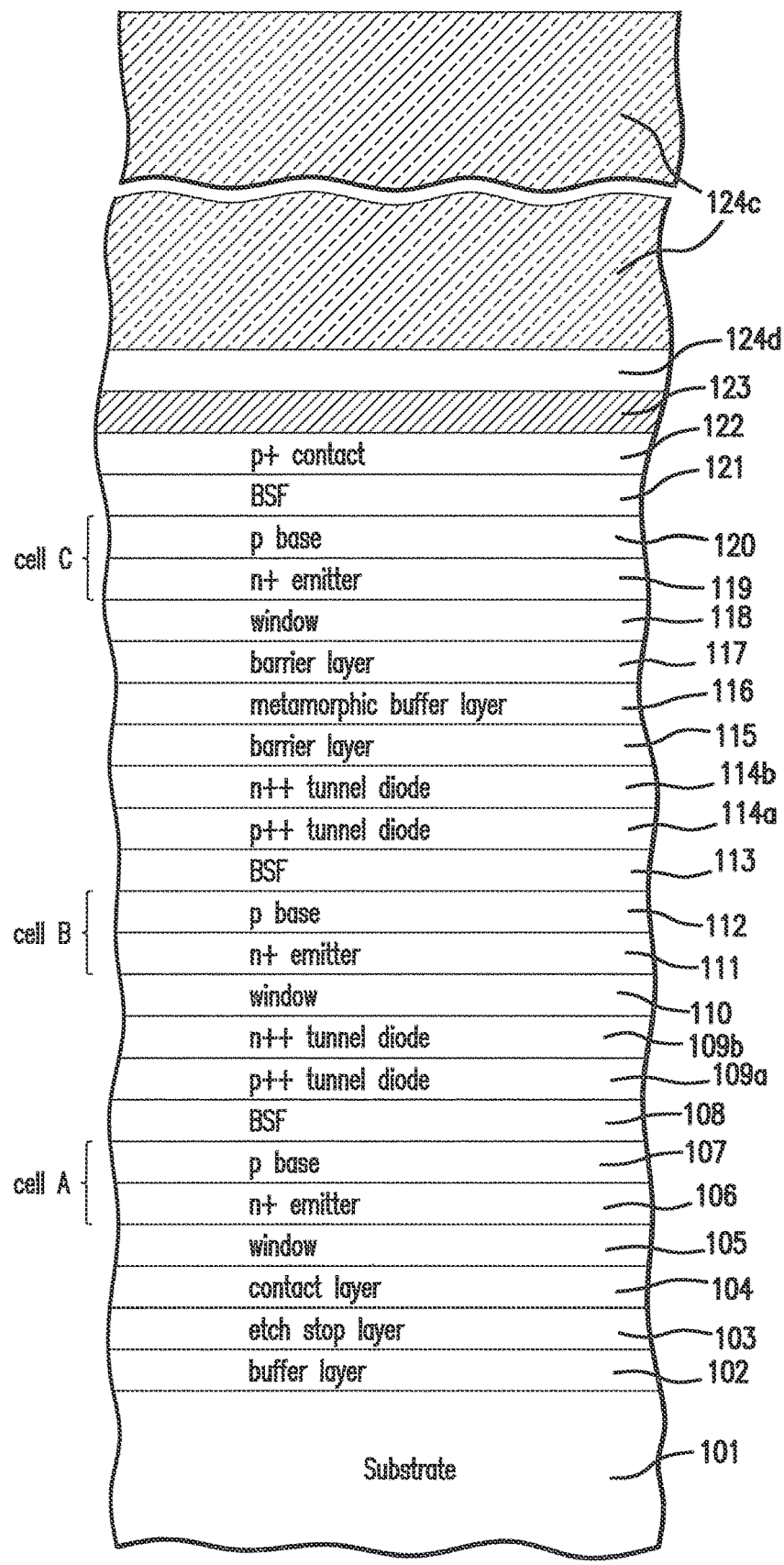
FIG. 5D is a cross-sectional view of the solar cell of FIG. 3 after the next process step in which a glass surrogate substrate having an adhesive polyimide layer bonded thereto as shown in FIG. 4C is attached.

FIG. 5D is a cross-sectional view of the solar cell of FIG. 3 after the next process step in which the permanent supporting substrate (e.g., a glass surrogate substrate having an adhesive polyimide layer bonded thereto as shown in FIG. 4C) is attached to the solar cell by a thermocompressive technique. Representative thermocompressive techniques include the use some form of press for directing pressure and heat, via conduction or convection, to the device. The step of adjoining the cured adhesive polyimide layer surface and the glass surrogate substrate to the surface of the sequence of layers of semiconductor material forming the solar cell can be performed at a temperature of, for example, about 300 degrees C.

Figure 5E:
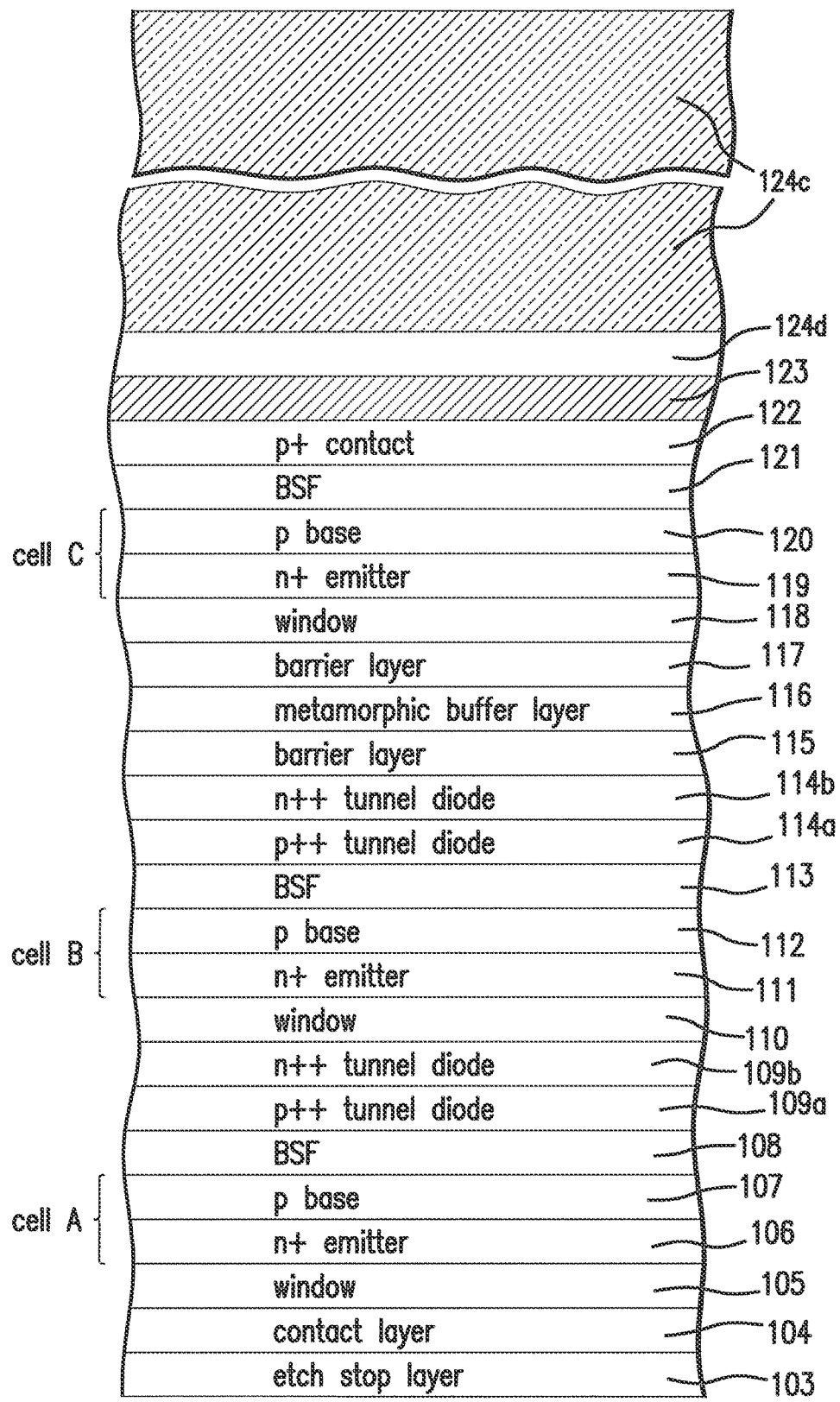
FIG. 5E is a cross-sectional view of the solar cell of FIG. 5D after the next process step in which the original substrate is removed.

FIG. 5E is a cross-sectional view of the solar cell of FIG. 5D after the next process step in which the original substrate is removed by a sequence of lapping, grinding and/or etching steps in which the substrate 101, and the buffer layer 102 are removed. The choice of a particular etchant is growth substrate dependent. In some embodiments, the substrate 101 may be removed by an epitaxial lift-off process, such as described in U.S. Patent Application Pub. No. 2010/0203730 A1 (Cornfeld et al.), and hereby incorporated by reference.

Figure 5F:
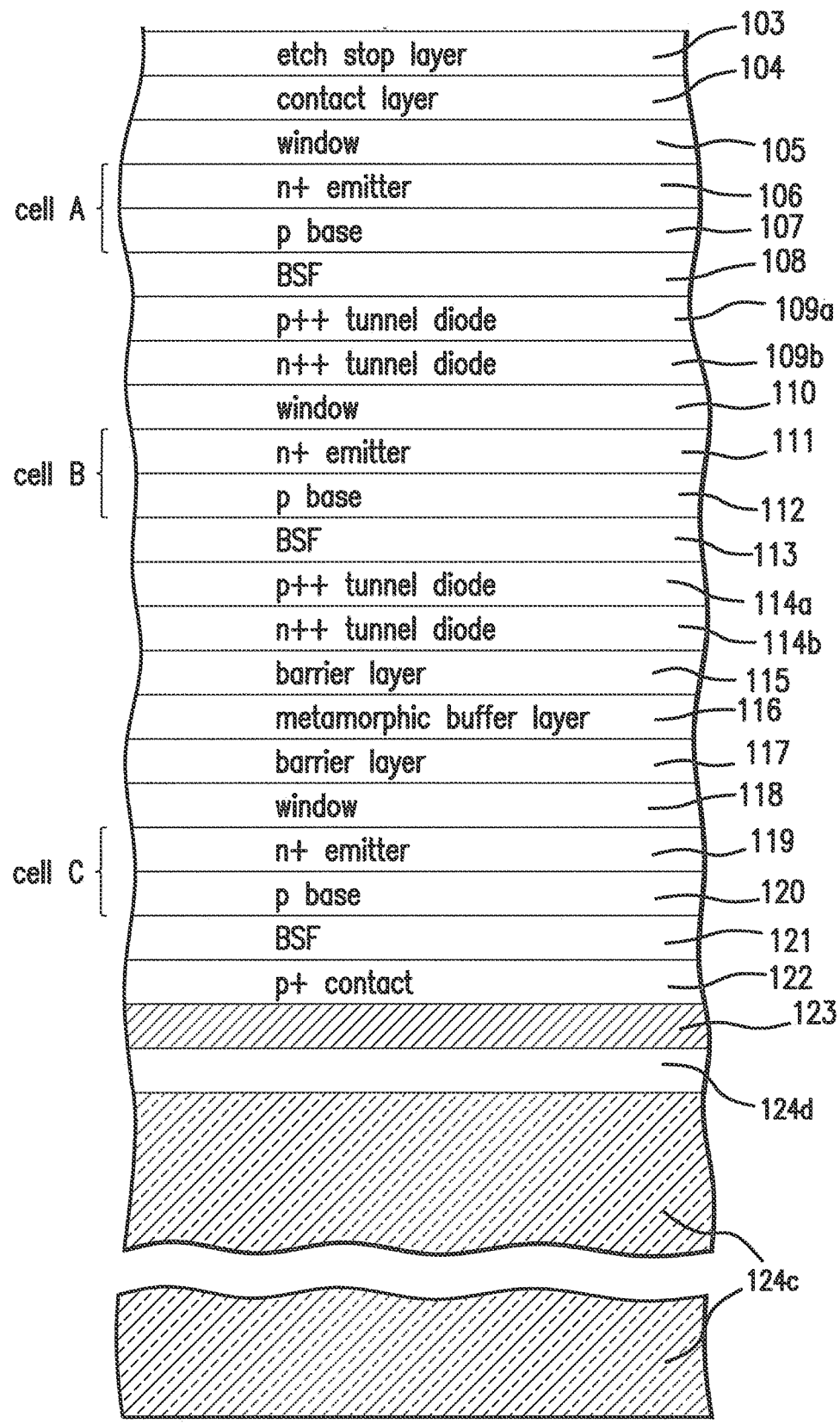
FIG. 5F is another cross-sectional view of the solar cell of FIG. 5E with the glass surrogate substrate on the bottom of the Figure.

FIG. 5F is another cross-sectional view of the solar cell of FIG. 5E with the glass surrogate substrate on the bottom of the Figure. Subsequent Figures in this embodiment will assume such orientation.

Figure 6A:
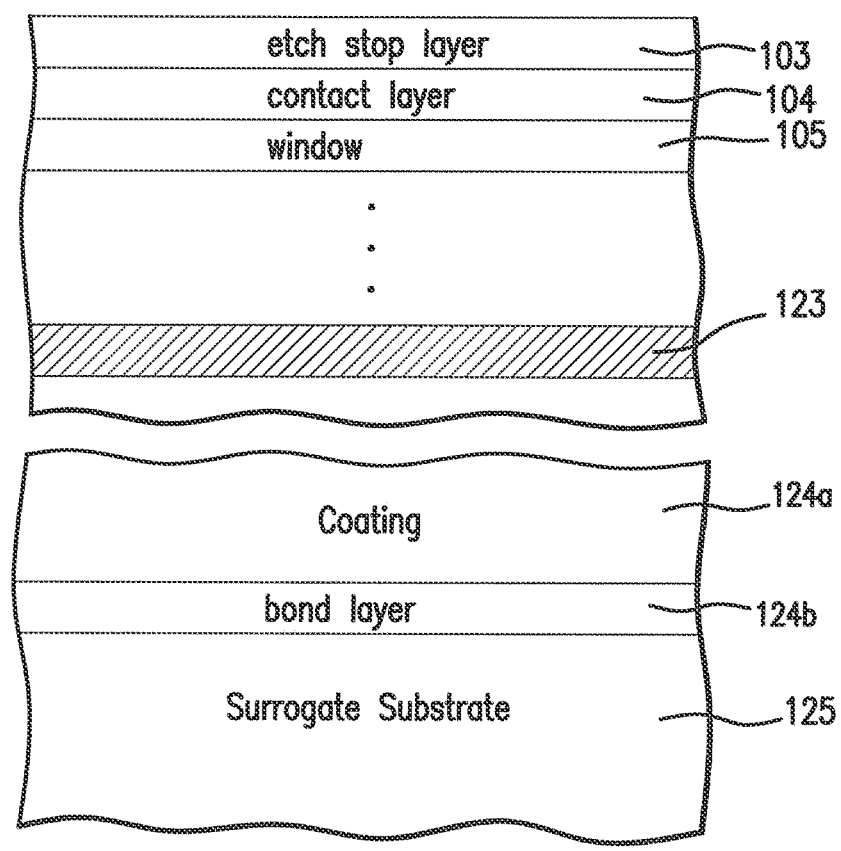
FIG. 6A is a simplified cross-sectional view of the solar cell of FIG. 5C.

FIG. 6A is a simplified cross-sectional view of the solar cell of FIG. 5C depicting just a few of the top layers and lower layers over the surrogate substrate 125.

Figure 6B:
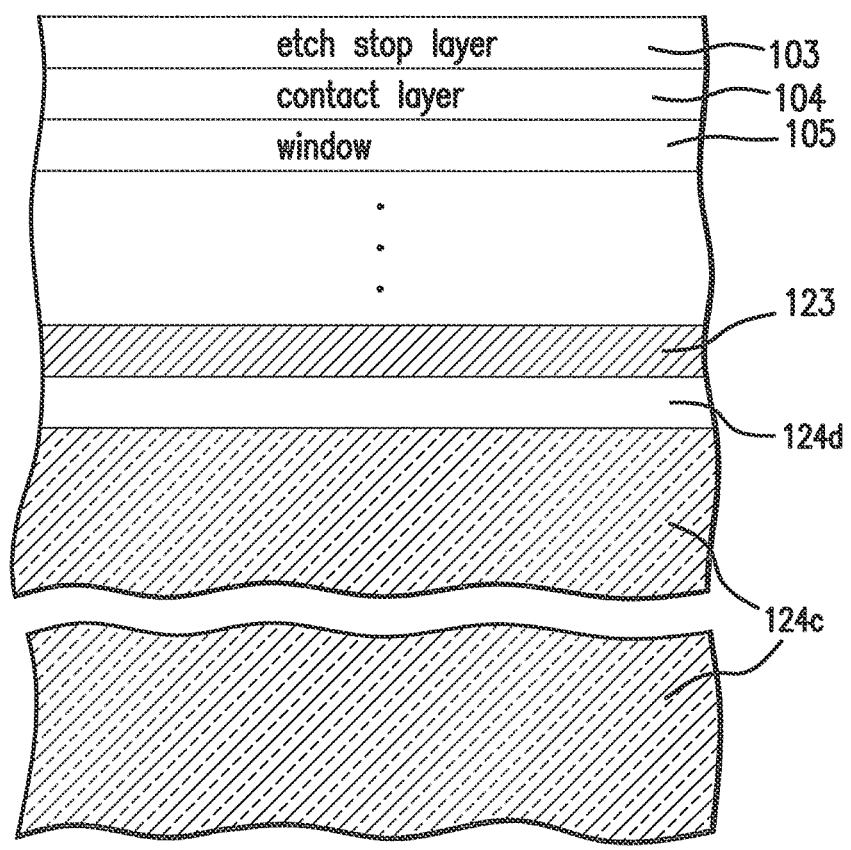
FIG. 6B is a simplified cross-sectional view of the solar cell of FIG. 5F.

FIG. 6B is a simplified cross-sectional view of the solar cell of FIG. 5F depicting just a few of the top layers and lower layers over glass surrogate substrate 124c and adhesive polyimide layer 124d.

Figure 7A:
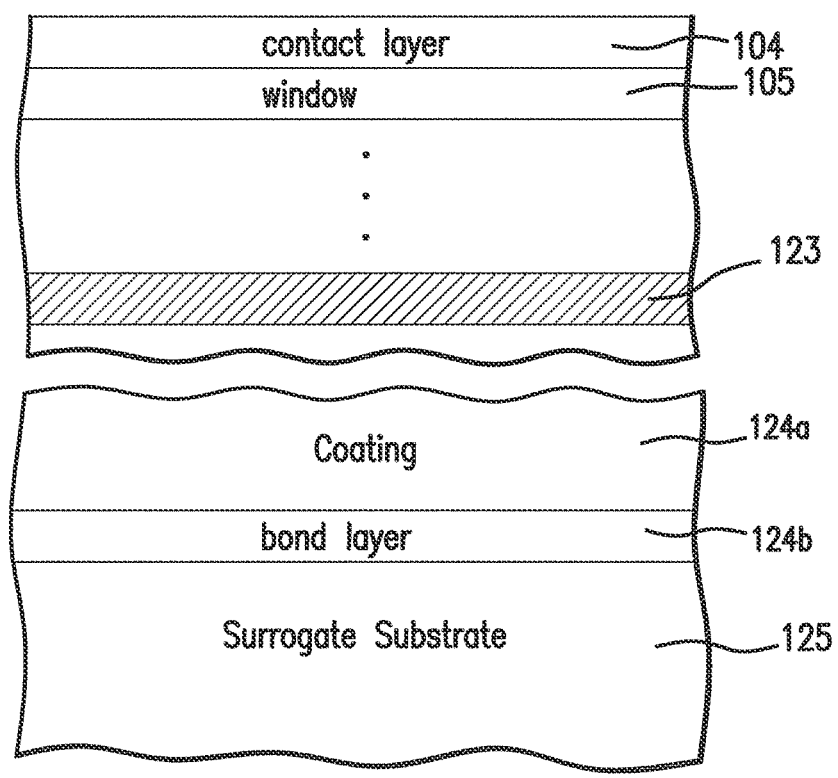
FIG. 7A is a cross-sectional view of the solar cell of FIG. 6A after the next process step.

FIG. 7A is a cross-sectional view of the solar cell of FIG. 6A after the next process step in which the etch stop layer 103 is removed by a HCl/$H_2O$ solution.

Figure 7B:
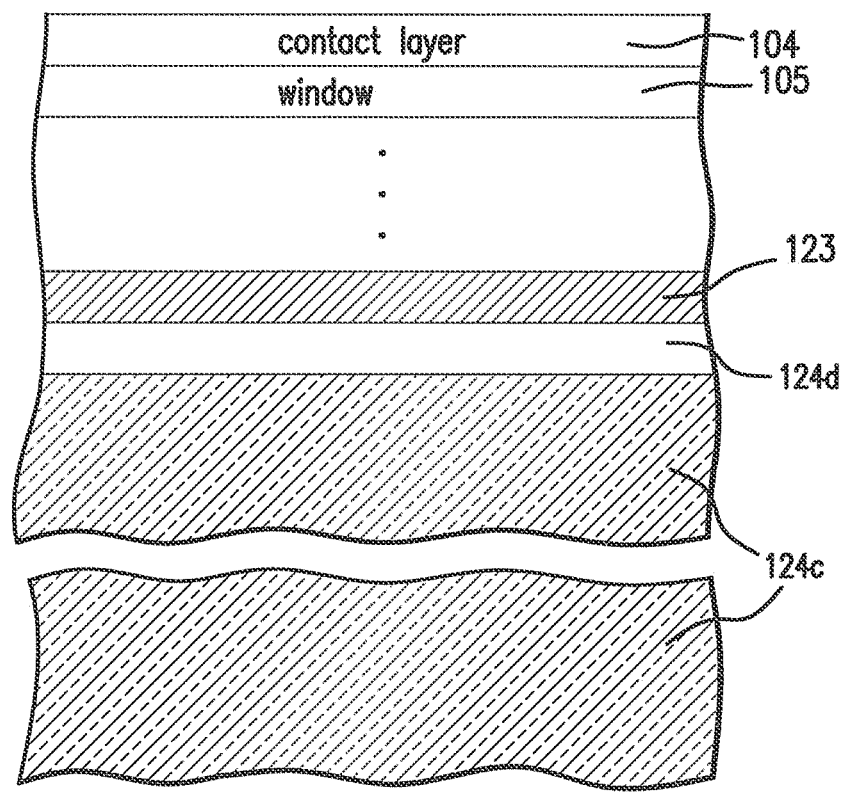
FIG. 7B is a cross-sectional view of the solar cell of FIG. 6B after the next process step.

FIG. 7B is a cross-sectional view of the solar cell of FIG. 6B after the next process step in which the etch stop layer 103 is removed by a HCl/$H_2O$ solution.

Figure 8A:
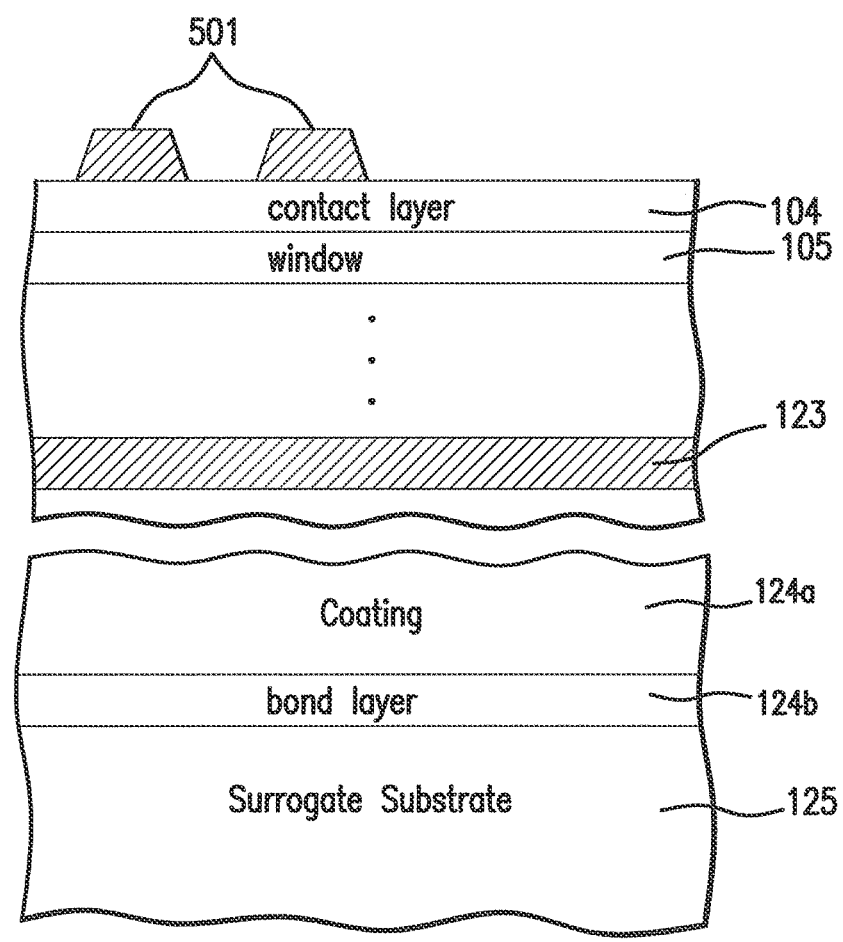
FIG. 8A is a cross-sectional view of the solar cell of FIG. 7A after the next process step.

FIG. 8A is a cross-sectional view of the solar cell of FIG. 7A after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

Figure 8B:
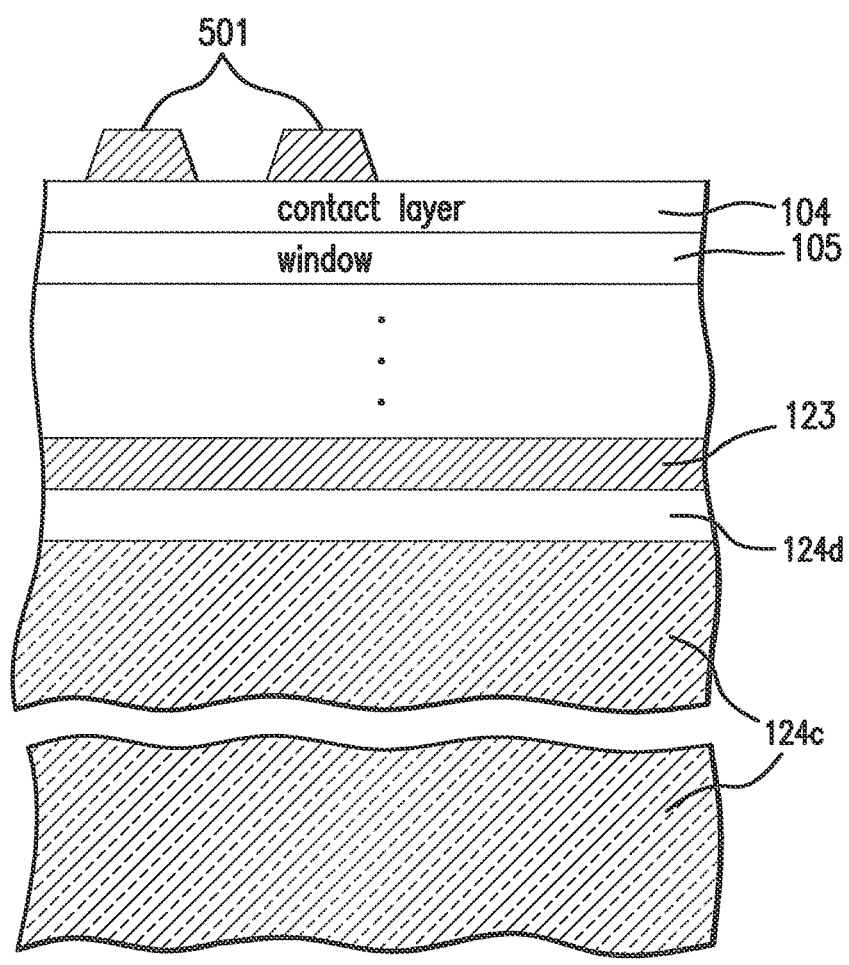
FIG. 8B is a cross-sectional view of the solar cell of FIG. 7B after the next process step.

FIG. 8B is a cross-sectional view of the solar cell of FIG. 7B after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

As more fully described in U.S. Patent Application Pub. No. 2010/0012175 A1 (Varghese et al.), hereby incorporated by reference, the grid lines 501 are preferably composed of the sequence of layers Pd/Ge/Ti/Pd/Au, although other suitable sequences and materials may be used as well.

Figure 9A:
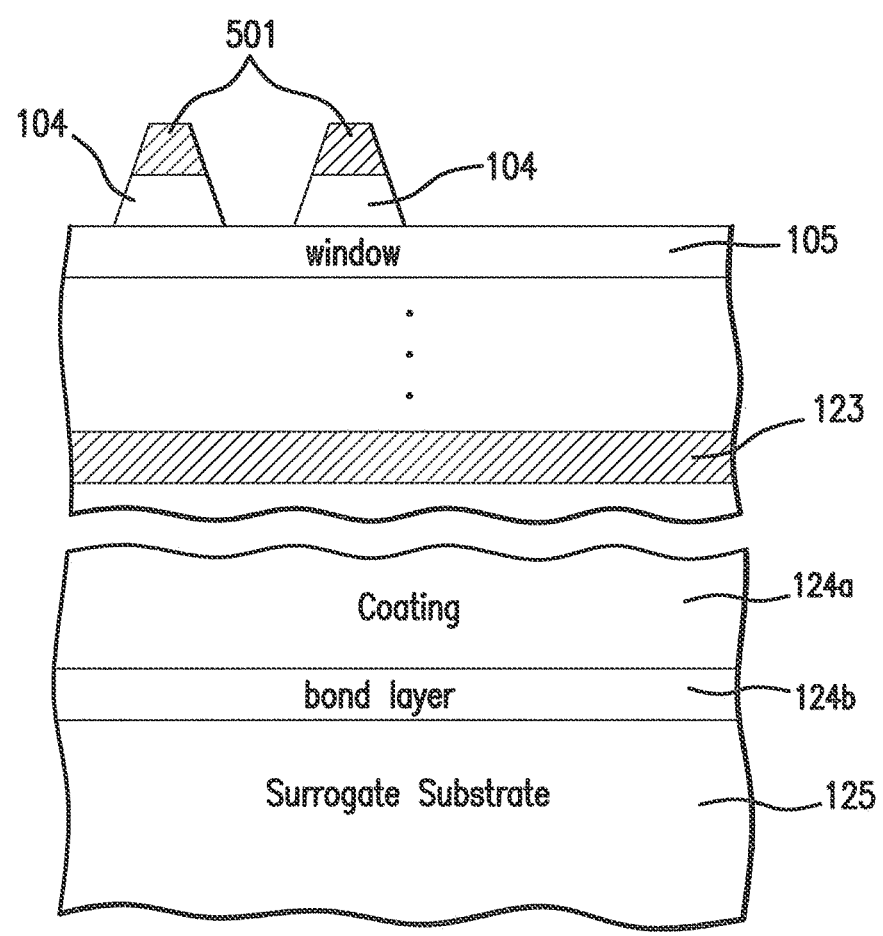
FIG. 9A is a cross-sectional view of the solar cell of FIG. 8A after the next process step.

FIG. 9A is a cross-sectional view of the solar cell of FIG. 8A after the next process step in which the grid lines are used as a mask to etch down the surface to the window layer 105 using a citric acid/peroxide etching mixture.

Figure 9B:
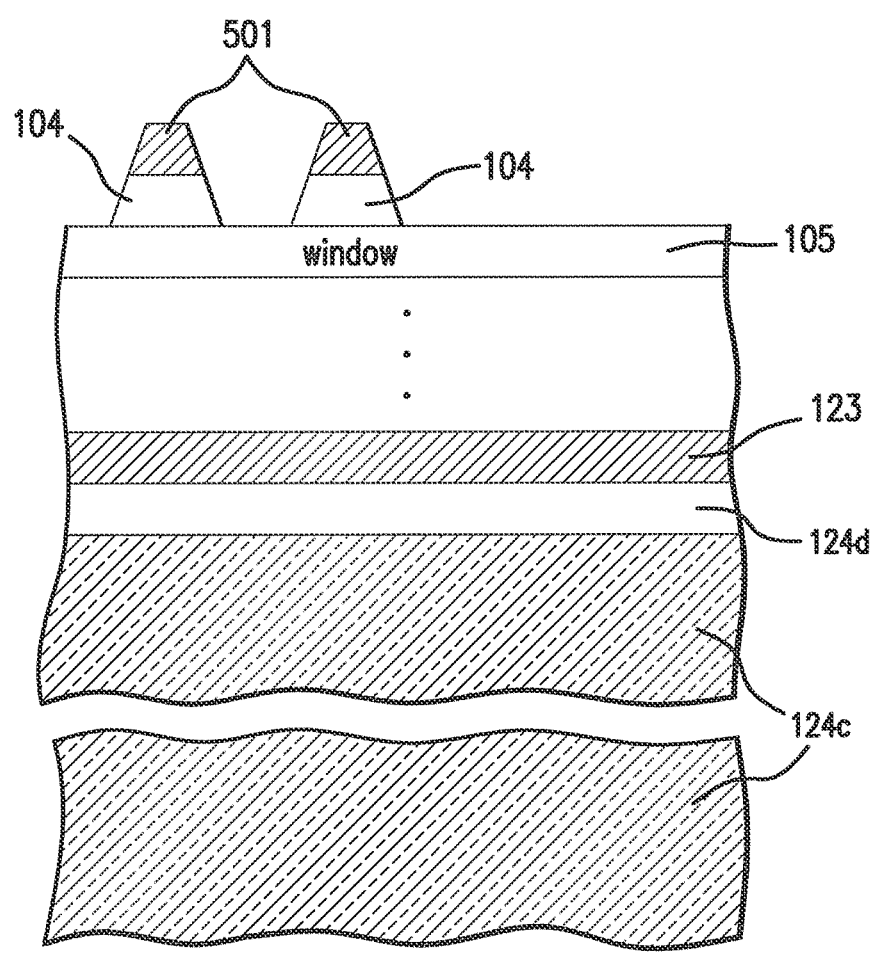
FIG. 9B is a cross-sectional view of the solar cell of FIG. 8B after the next process step.

FIG. 9B is a cross-sectional view of the solar cell of FIG. 8B after the next process step in which the grid lines are used as a mask to etch down the surface to the window layer 105 using a citric acid/peroxide etching mixture.

Figure 10A:
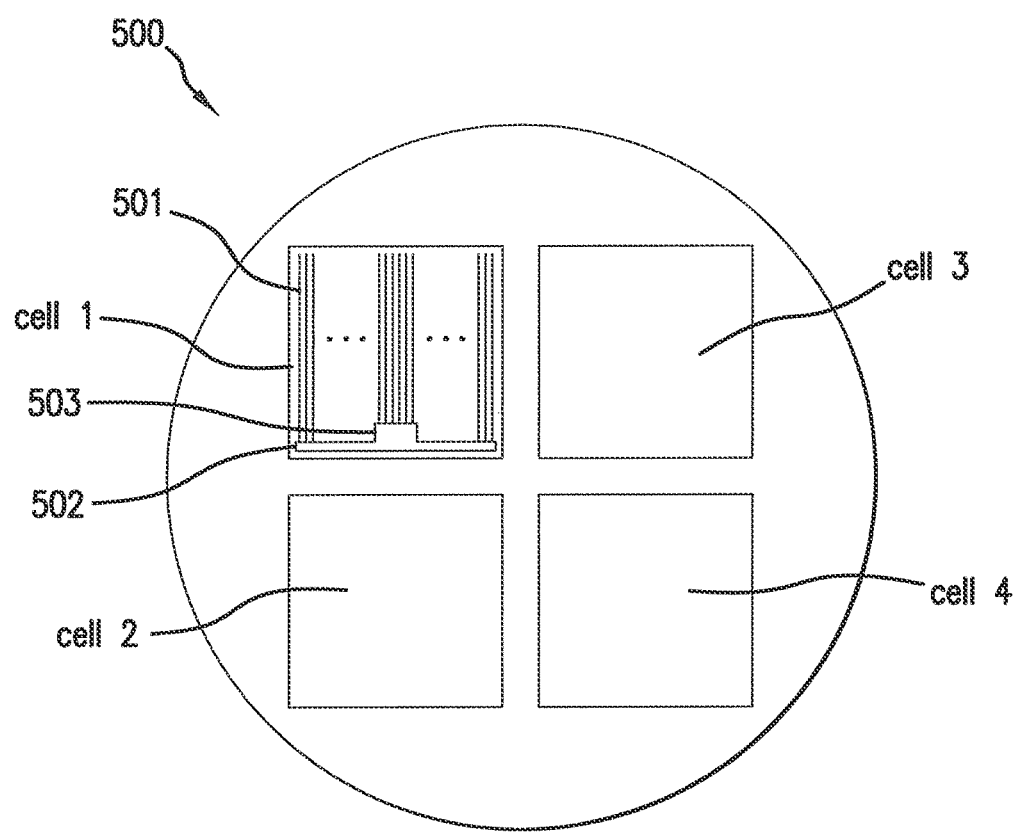
FIG. 10A is a top plan view of a wafer in which four solar cells are fabricated.

FIG. 10A is a top plan view of a 100 mm (or 4 inch) wafer in which four solar cells are implemented. The depiction of four cells is for illustration purposes only, and the present invention is not limited to any specific number of cells per wafer.

In each cell there are grid lines 501 (more particularly shown in cross-section in FIGS. 9A and 9B), an interconnecting bus line 502, and a contact pad 503. The geometry and number of grid and bus lines and contact pads are illustrative, and the present invention is not limited to the illustrated embodiment.

Figure 10B:
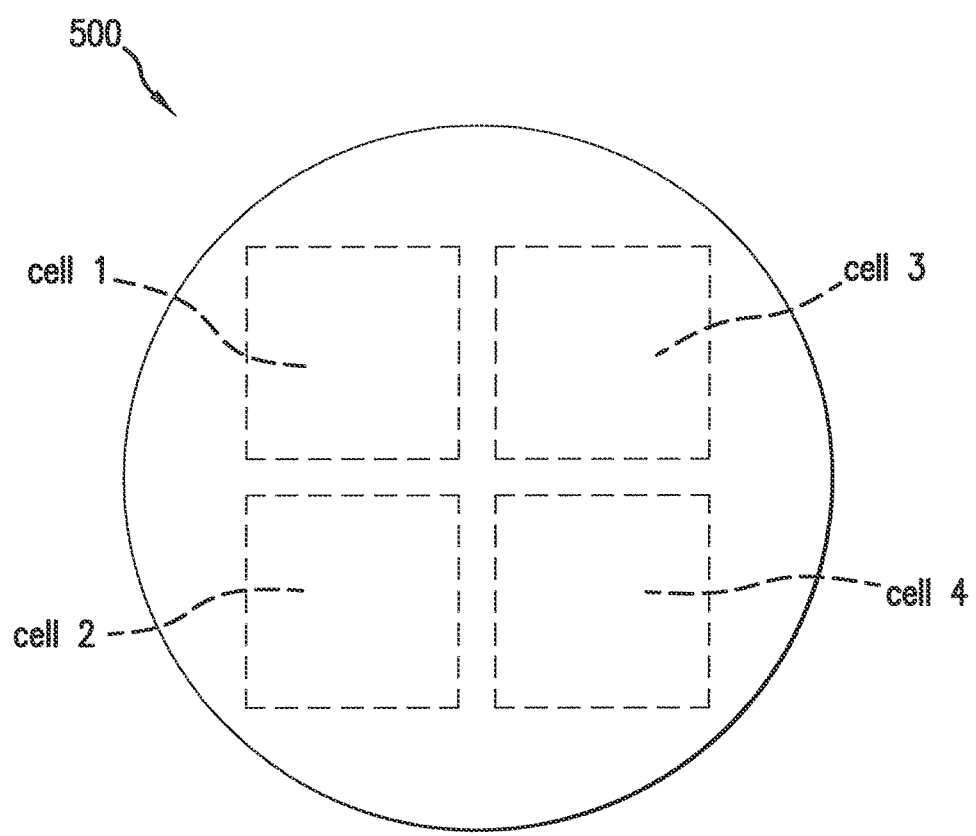
FIG. 10B is a bottom plan view of the wafer of FIG. 10A.

FIG. 10B is a bottom plan view of the wafer of FIG. 10A.

Figure 10C:
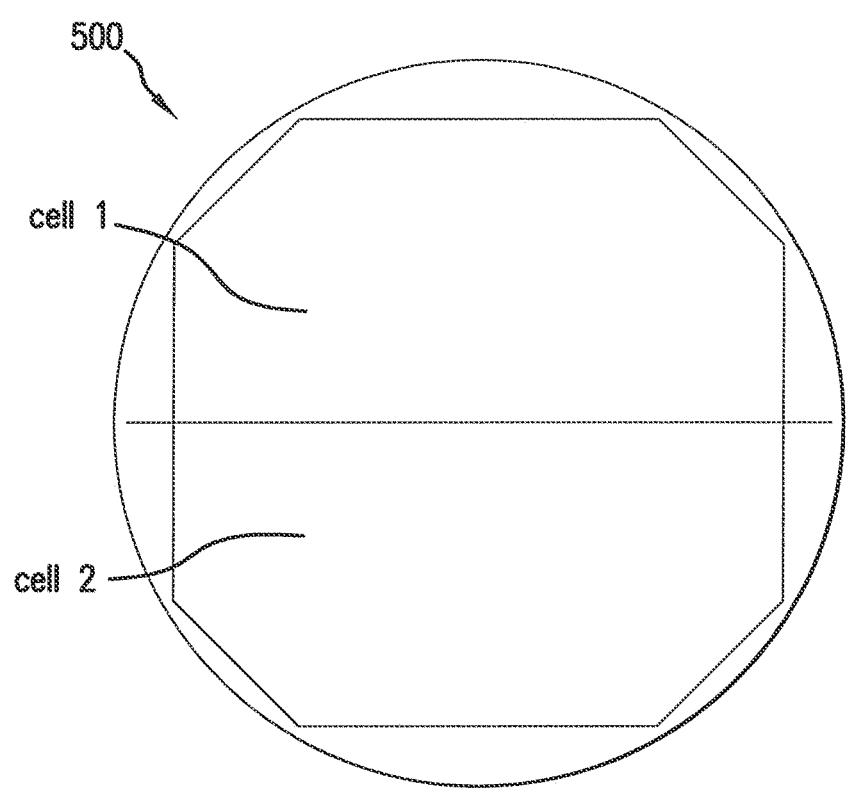
FIG. 10C is a top plan view of a wafer in which two solar cells are fabricated.

FIG. 10C is a top plan view of a 100 mm (or 4 inch) wafer in which two solar cells are implemented. Each solar cell has an area of 26.3 $cm^2$ and after fabrication will have a power/weight ratio (after separation from the growth and surrogate substrates, and including a 4 mil thick cover glass) of 945 mW/g.

Figure 11A:
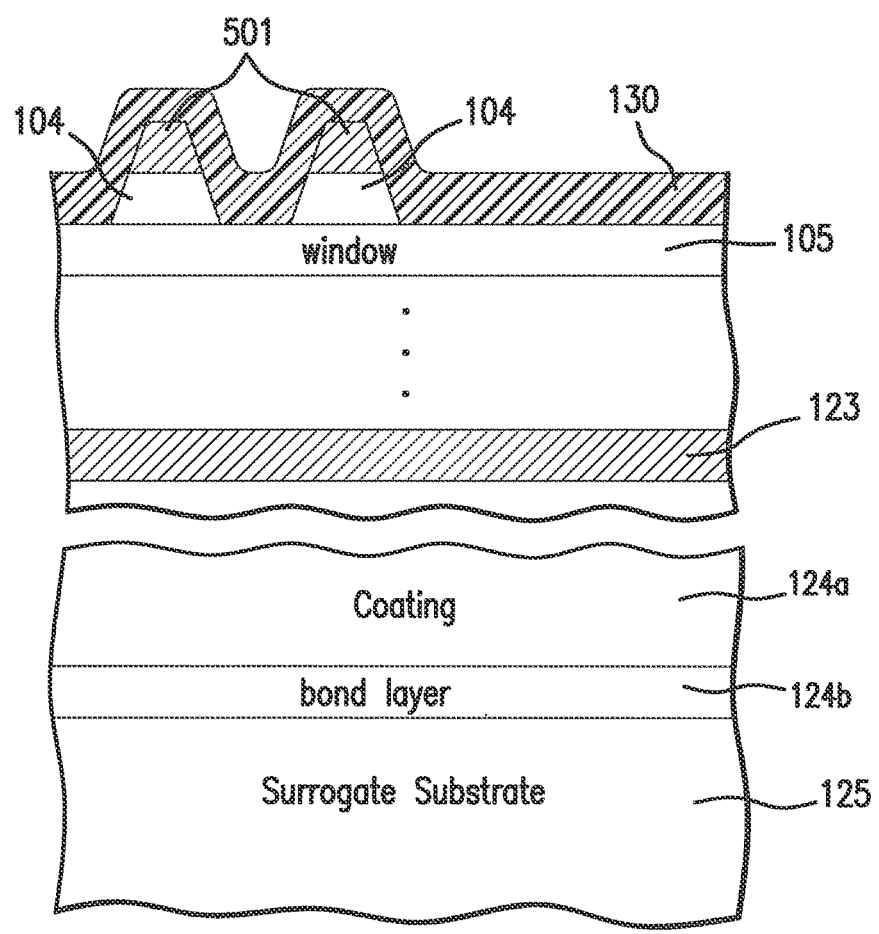
FIG. 11A is a cross-sectional view of the solar cell of FIG. 9A after the next process step.

FIG. 11A is a cross-sectional view of the solar cell of FIG. 9A after the next process step in which an antireflective (ARC) dielectric coating layer 130 is applied over the entire surface of the "top" side of the wafer with the grid lines 501.

Figure 11B:
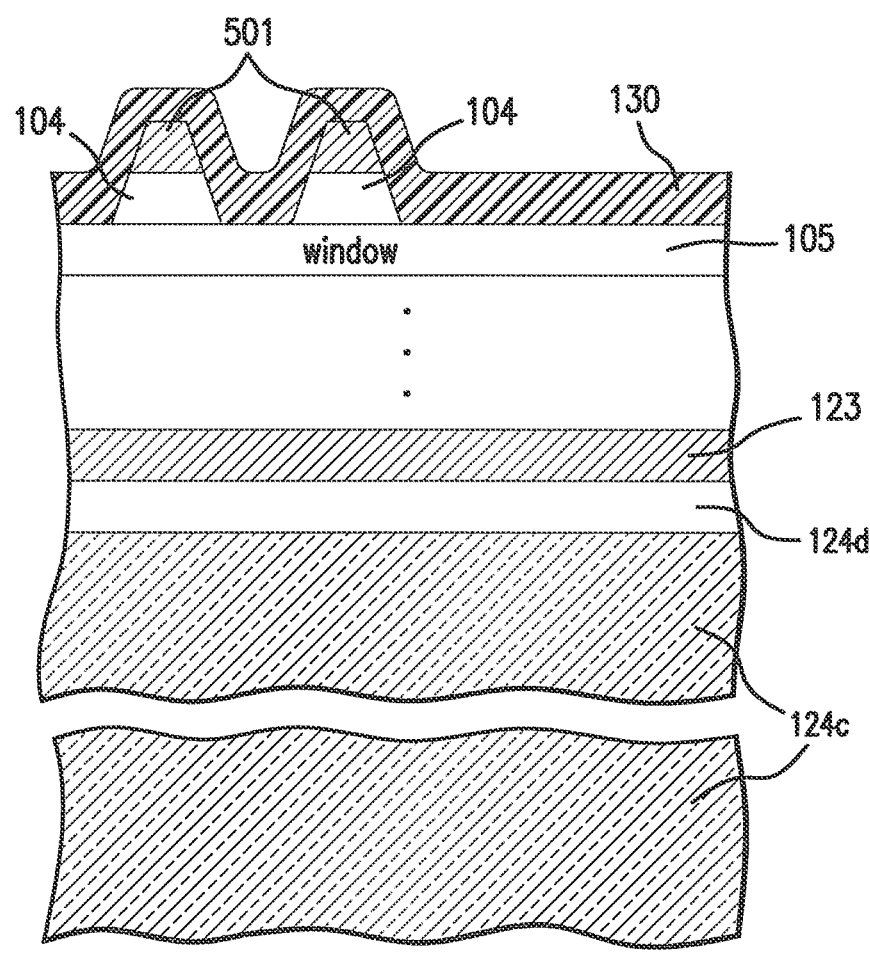
FIG. 11B is a cross-sectional view of the solar cell of FIG. 9B after the next process step.

FIG. 11B is a cross-sectional view of the solar cell of FIG. 9B after the next process step in which an antireflective (ARC) dielectric coating layer 130 is applied over the entire surface of the "top" side of the wafer with the grid lines 501.

Figure 12A:
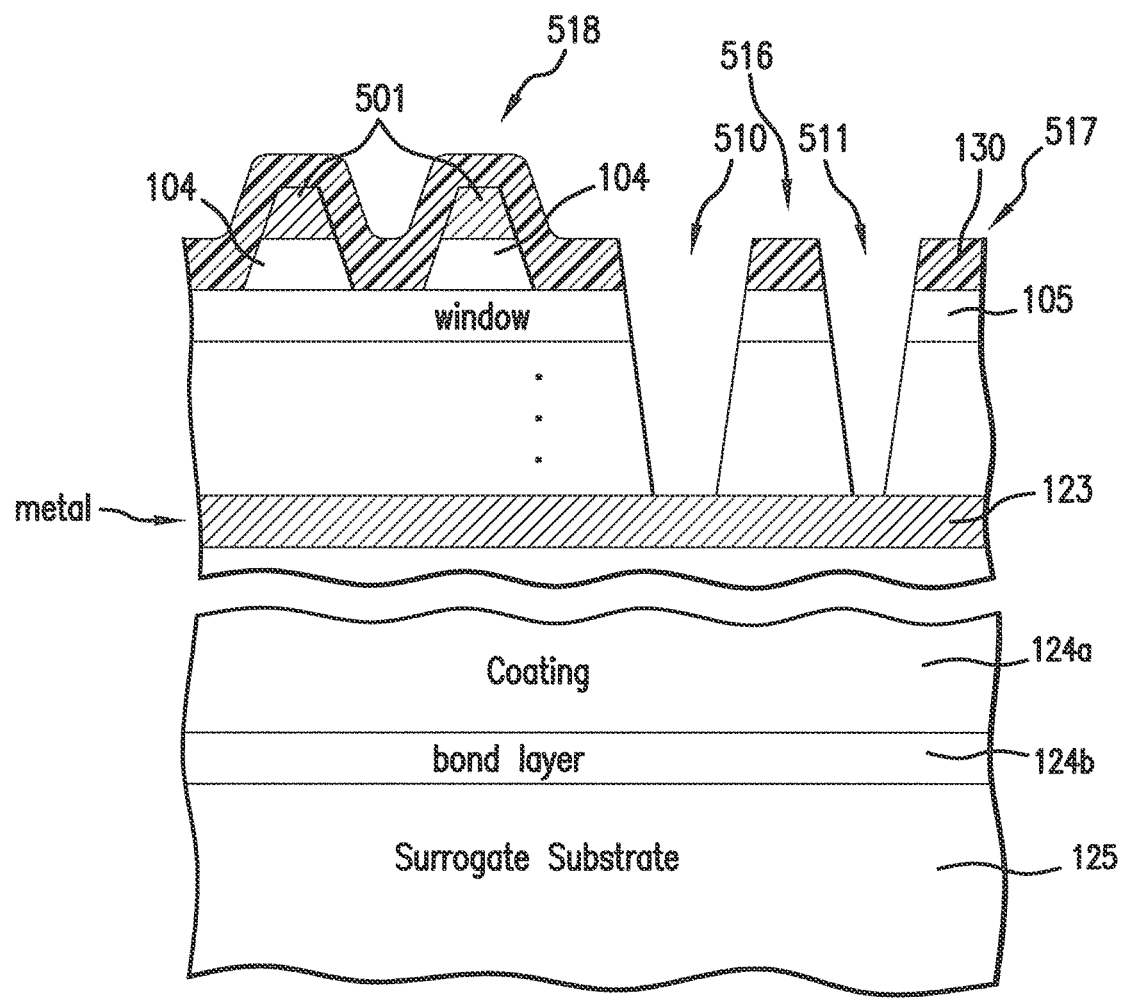
FIG. 12A is a cross-sectional view of the solar cell of FIG. 11A after the next process step.

FIG. 12A is a cross-sectional view of the solar cell of FIG. 11A after the next process step according to the present invention in which first and second annular channels 510 and 511, or portion of the semiconductor structure are etched down to the metal layer 123 using phosphide and arsenide etchants. These channels, as more particularly described in U.S. Pat. No. 7,741,146 (Cornfeld et al.), define a peripheral boundary between the cell, a surrounding mesa 516, and a periphery mesa 517 at the edge of the wafer, and leave a mesa structure 518 which constitutes the solar cell. The cross-section depicted in FIG. 12A is that as seen from the A-A plane shown in FIG. 13A.

Figure 12B:
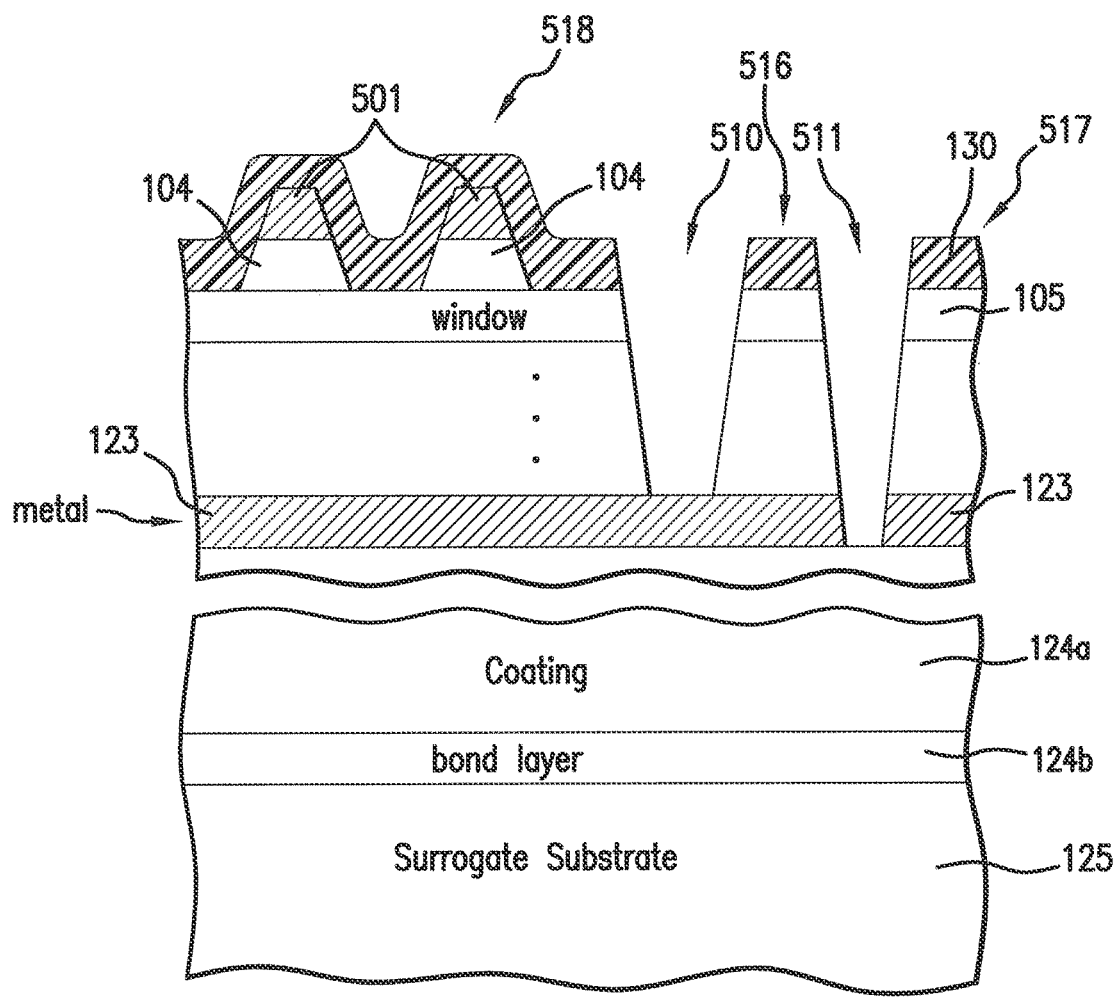
FIG. 12B is a cross-sectional view of the solar cell of FIG. 12A after the next process step.

FIG. 12B is a cross-sectional view of the solar cell of FIG. 12A after the next process step in which channel 511 is exposed to a metal etchant, layer 123 in the channel 511 is removed, and channel 511 is extended in depth approximately to the top surface of the bond layer 124.

Figure 12C:
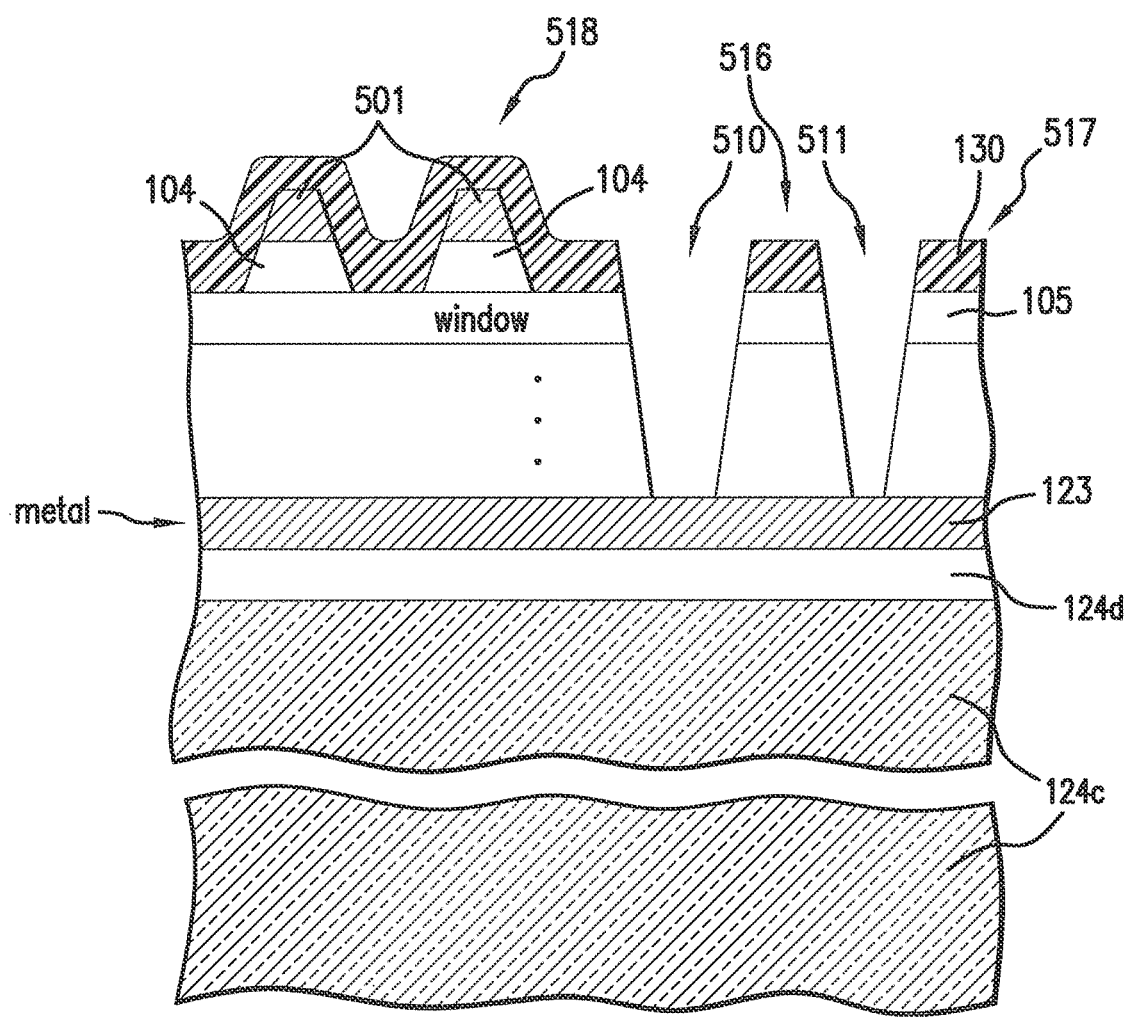
FIG. 12C is a cross-sectional view of the solar cell of FIG. 11B after the next process step.

FIG. 12C is a cross-sectional view of the solar cell of FIG. 11B after the next process step according to the present invention in which first and second annular channels 510 and 511, or portion of the semiconductor structure are etched down to the metal layer 123 using phosphide and arsenide etchants. These channels, as more particularly described in U.S. Pat. No. 7,741,146 (Cornfeld et al.), define a peripheral boundary between the cell, a surrounding mesa 516, and a periphery mesa 517 at the edge of the wafer, and leave a mesa structure 518 which constitutes the solar cell. The cross-section depicted in FIG. 12A is that as seen from the A-A plane shown in FIG. 13A.

Figure 12D:
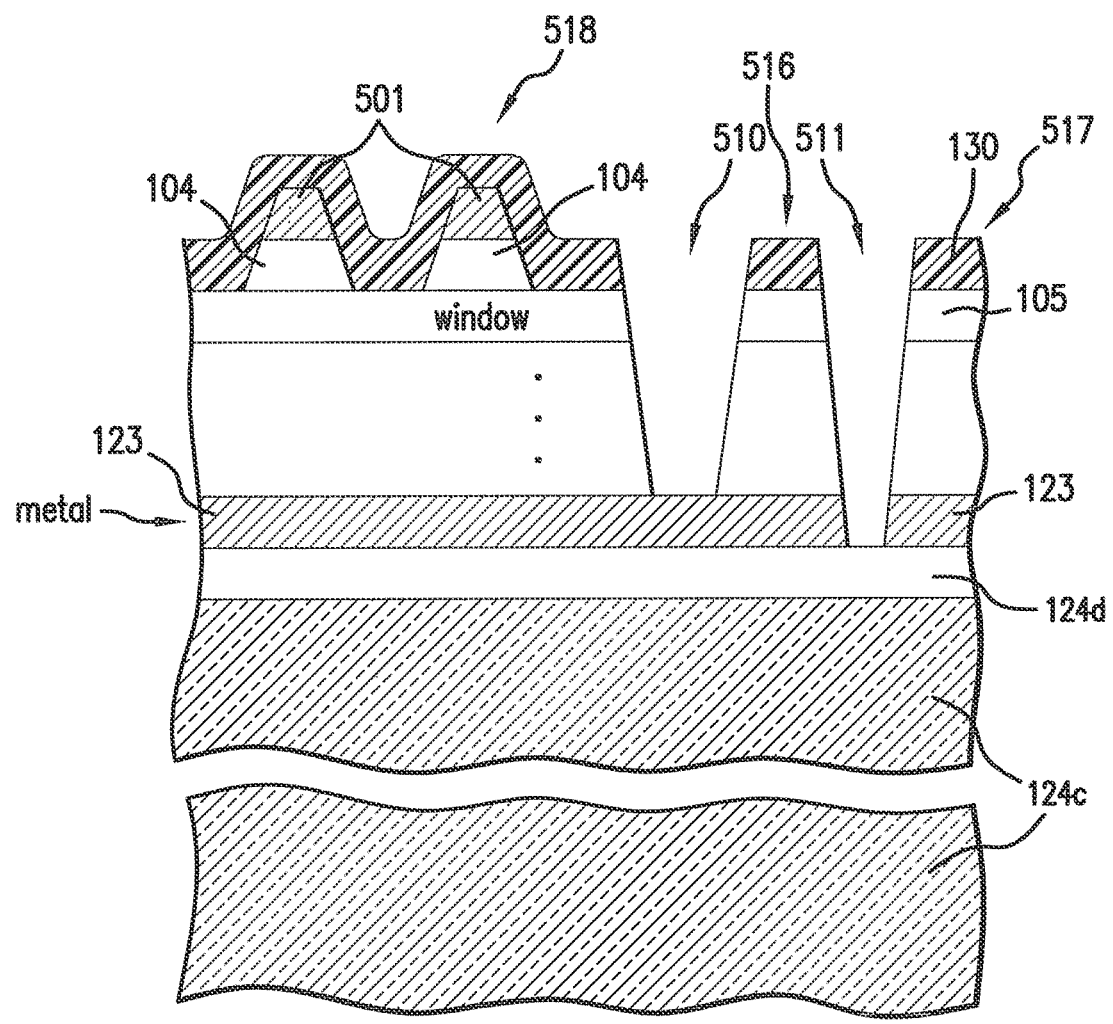
FIG. 12D is a cross-sectional view of the solar cell of FIG. 12C after the next process step.

FIG. 12D is a cross-sectional view of the solar cell of FIG. 12C after the next process step in which channel 511 is exposed to a metal etchant, layer 123 in the channel 511 is removed, and channel 511 is extended in depth approximately to the top surface of the bond layer 124.

Figure 13A:
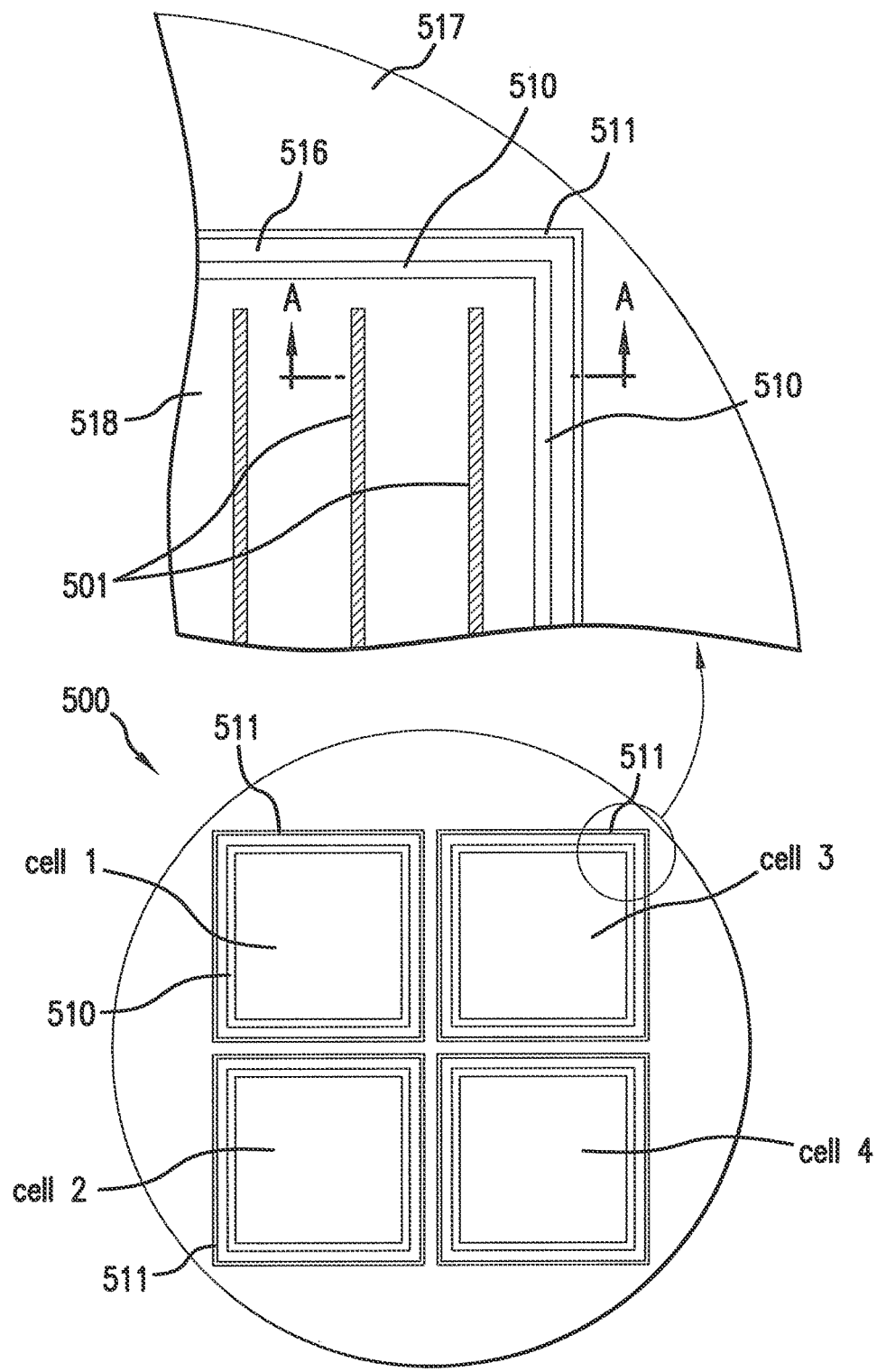
FIG. 13A is a top plan view of the wafer of FIG. 10A depicting the surface view of the trench etched around the cell, after the process step depicted in FIG. 12B.

FIG. 13A is a top plan view of the wafer of FIG. 10A depicting the channels 510 and 511 etched around the periphery of each cell.

Figure 13B:
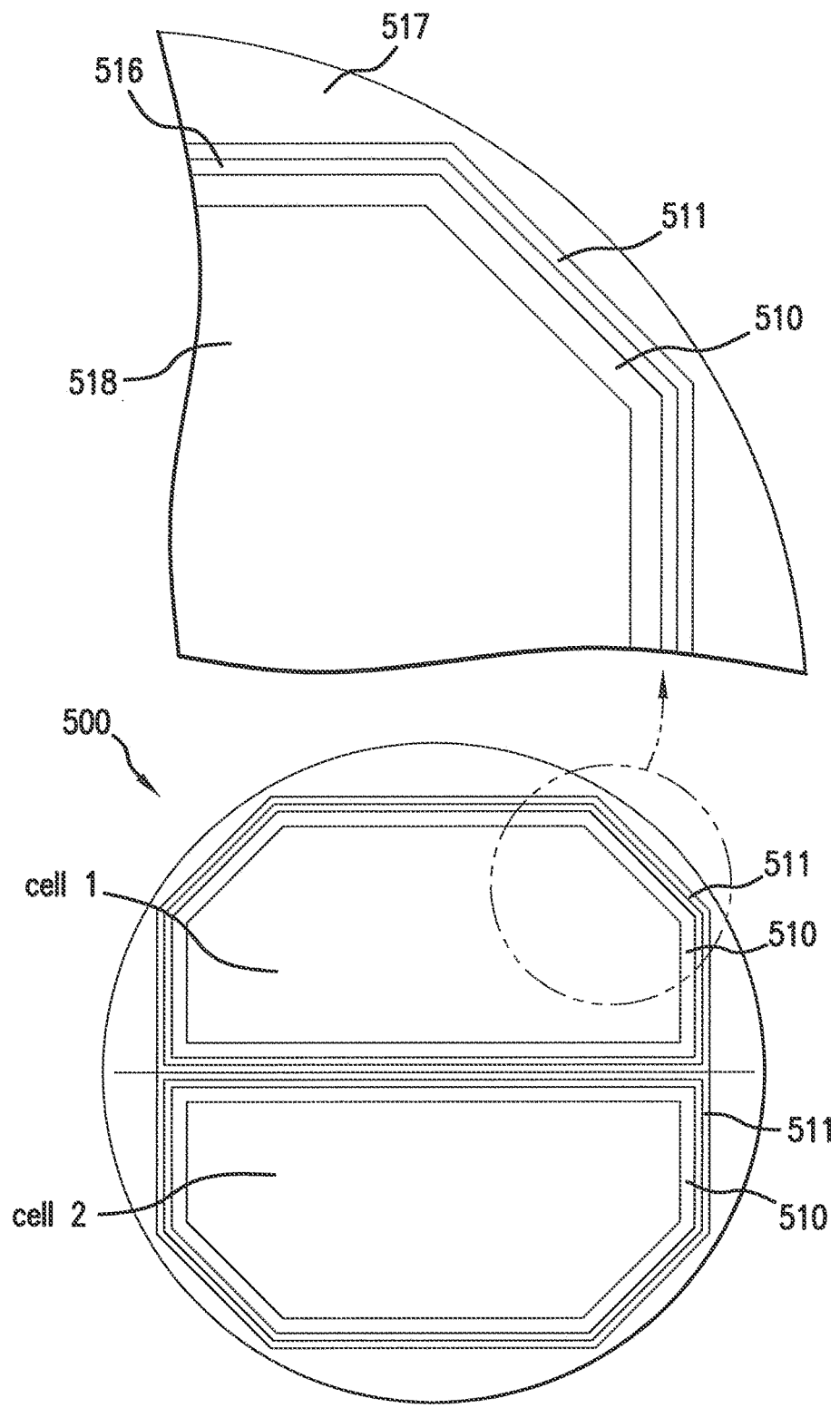
FIG. 13B is a top plan view of the wafer of FIG. 10C depicting the surface view of the trench etched around the cell, after the process step depicted in FIG. 12B.

FIG. 13B is a top plan view of the wafer of FIG. 10C depicting the channels 510 and 511 etched around the periphery of each cell.

Figure 14A:
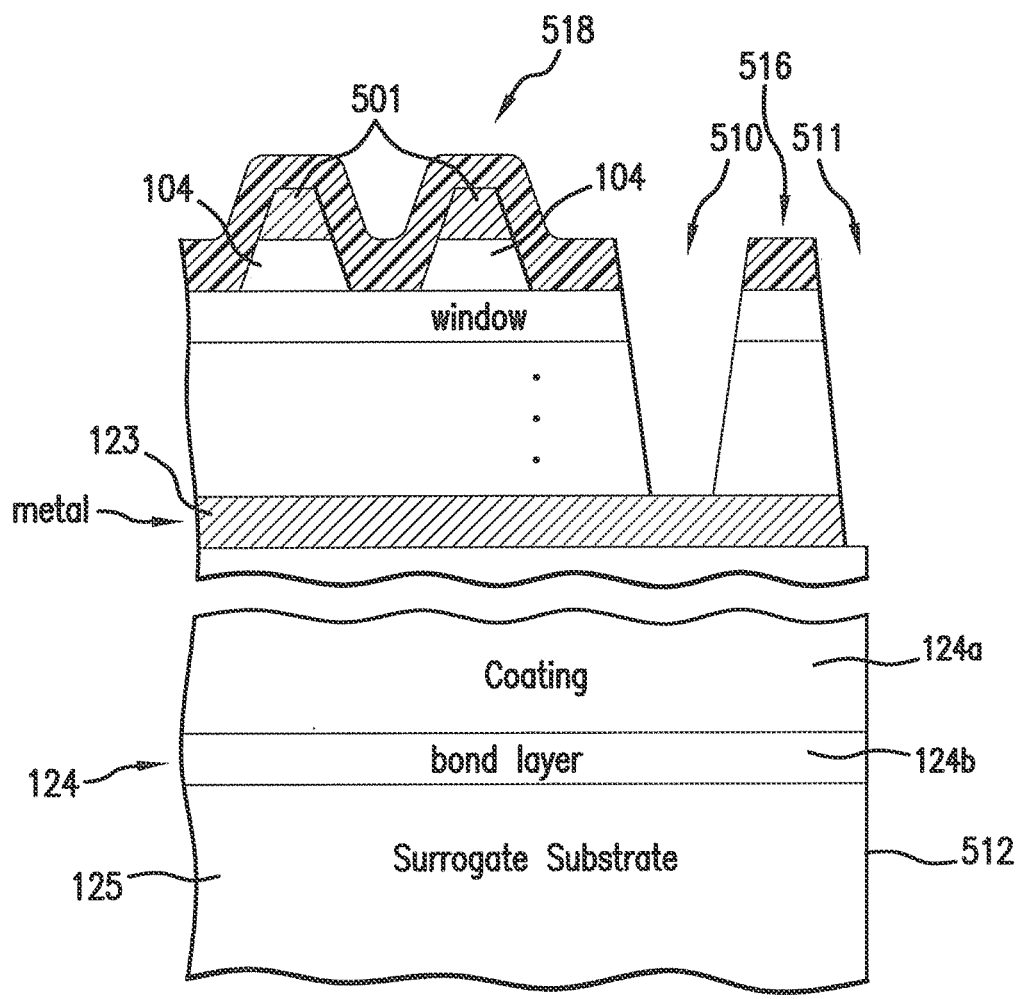
FIG. 14A is a cross-sectional view of the solar cell of FIG. 12B after the next process step in a first embodiment of the present invention.

FIG. 14A is a cross-sectional view of the solar cell of FIG. 12B after the individual solar cells (cell 1, cell 2, etc. shown in FIG. 13) are cut or scribed from the wafer through the channel 511, leaving a vertical edge 512 extending through the surrogate substrate 125. In this first embodiment of the present invention, the surrogate substrate 125 forms the support for the solar cell in applications where a cover glass (such as provided in the third embodiment to be described below) is not required. In such an embodiment, electrical contact to the metal contact layer 123 may be made through the channel 510.

Figure 14B:
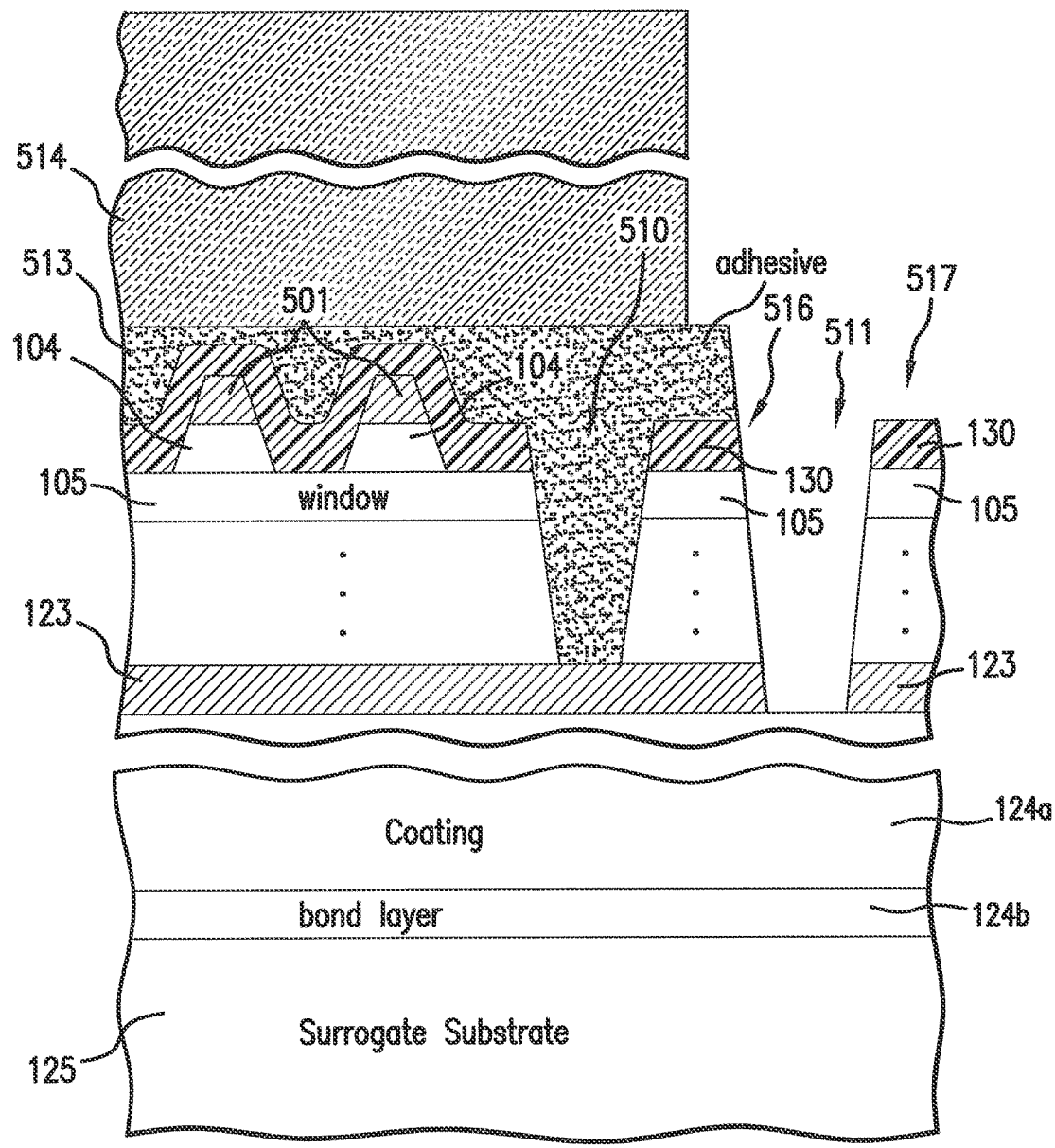
FIG. 14B is a cross-sectional view of the solar cell of FIG. 12B after the next process step in a second embodiment of the present invention.

FIG. 14B is a cross-sectional view of the solar cell of FIG. 12B after the next process step in a second embodiment of the present invention in which a cover glass 514 is secured to the top of the cell by an adhesive 513. The cover glass 514 is typically about 4 mils thick and preferably covers the entire channel 510, extends over a portion of the mesa 516, but does not extend to channel 511. Although the use of a cover glass is desirable for many environmental conditions and applications, it is not necessary for all implementations, and additional layers or structures may also be utilized for providing additional support or environmental protection to the solar cell.

Figure 14C:
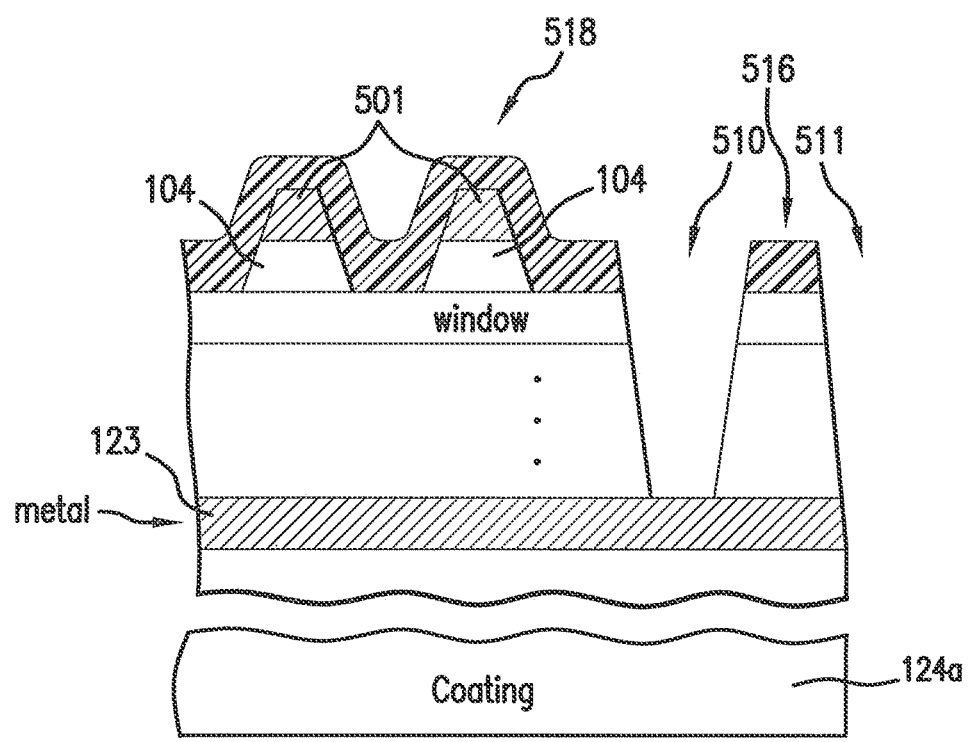
FIG. 14C is a cross-sectional view of the solar cell of FIG. 14A after the next process step of removal of the surrogate substrate.

FIG. 14C is a cross-sectional view of the solar cell of FIG. 14A after the next process step in some embodiments of the present invention in which the adhesive layer 124, the surrogate substrate 125 and the peripheral portion 517 of the wafer is entirely removed, leaving only the solar cell with the ARC layer 130 (or other layers or structures) on the top, and the coating layer 124a on the bottom, while the metal contact layer 123 forms the backside contact of the solar cell. The surrogate substrate is preferably removed by the use of a 'Wafer Bond' solvent. As noted above, the surrogate substrate includes perforations over its surface that allow the flow of solvent through the surrogate substrate 125 to permit its lift-off. After lift-off, the surrogate substrate may be reused in subsequent wafer processing operations.

Figure 14D:
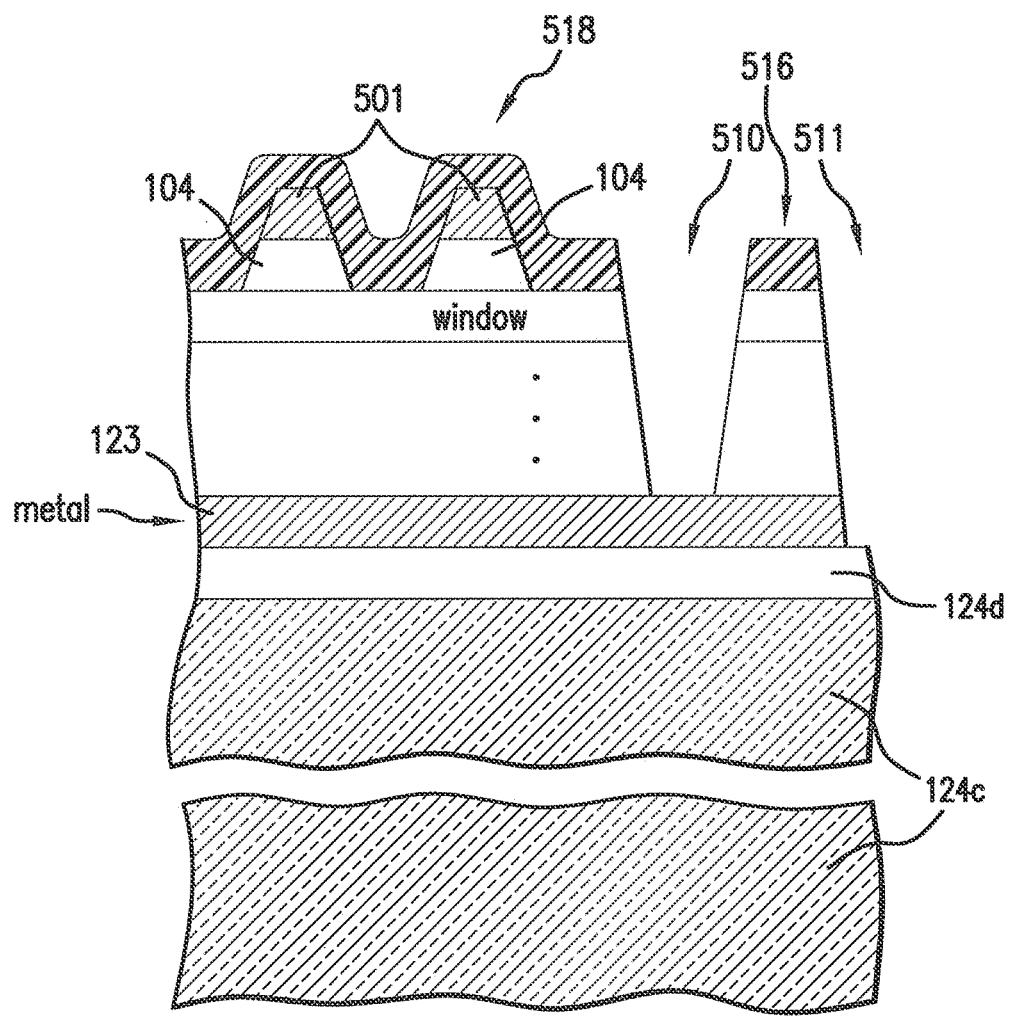
FIG. 14D is a cross-sectional view of the solar cell of FIG. 12D after the next process step in a fourth embodiment of the present invention.

FIG. 14D is a cross-sectional view of the solar cell of FIG. 12D after the individual solar cells (cell 1, cell 2, etc. shown in FIG. 13) are cut or scribed from the wafer through the channel 511, leaving a vertical edge 512 extending through the surrogate substrate 125. In this fourth embodiment of the present invention, the surrogate substrate 125 forms the support for the solar cell in applications where a cover glass (such as provided in the third embodiment to be described below) is not required. In such an embodiment, electrical contact to the metal contact layer 123 may be made through the channel 510.

Figure 14E:
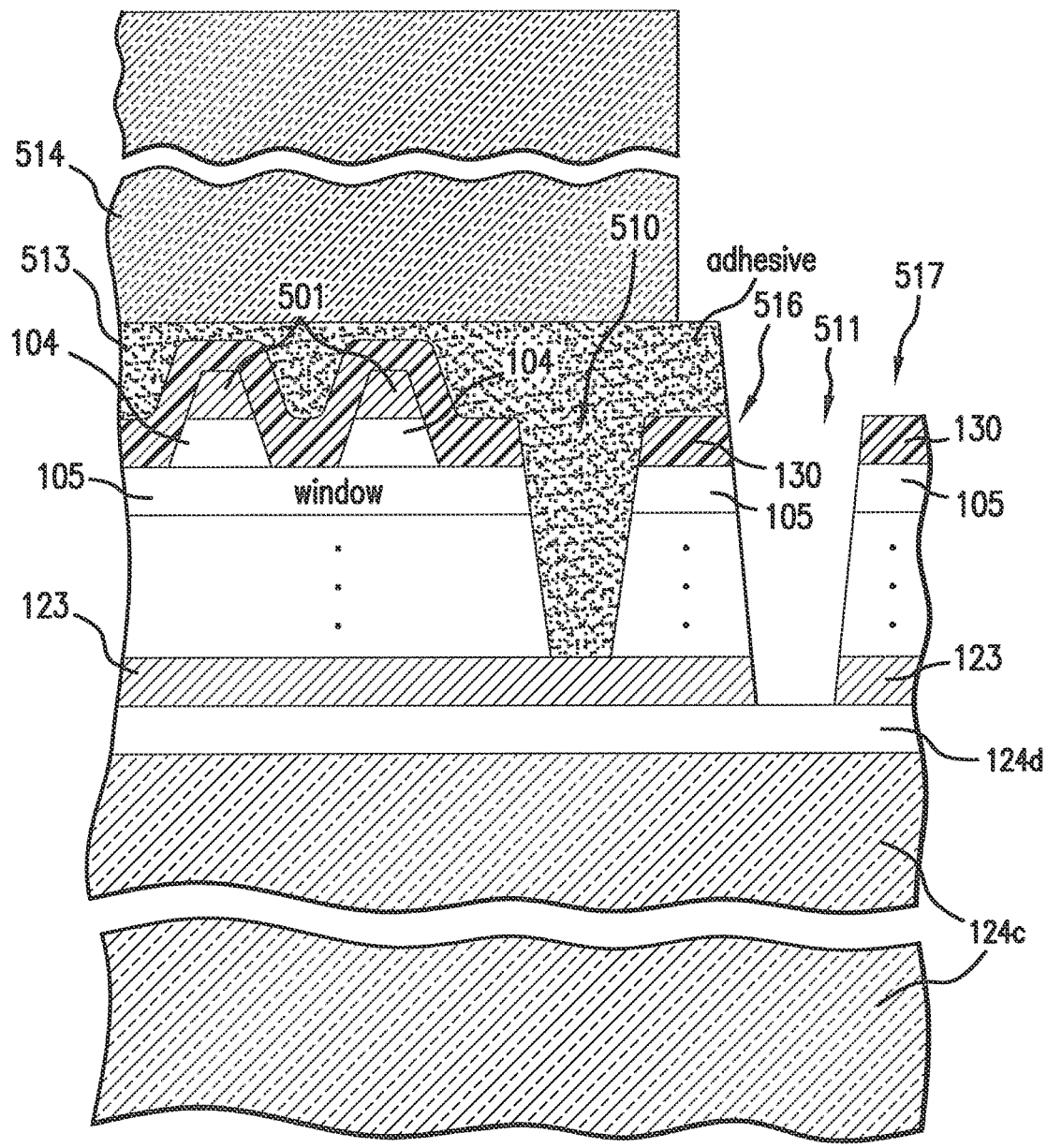
FIG. 14E is a cross-sectional view of the solar cell of FIG. 12D after the next process step in a fifth embodiment of the present invention.

FIG. 14E is a cross-sectional view of the solar cell of FIG. 12D after the next process step in a fifth embodiment of the present invention in which a cover glass 514 is secured to the top of the cell by an adhesive 513. The cover glass 514 is typically about 4 mils thick and preferably covers the entire channel 510, extends over a portion of the mesa 516, but does not extend to channel 511. Although the use of a cover glass is desirable for many environmental conditions and applications, it is not necessary for all implementations, and additional layers or structures may also be utilized for providing additional support or environmental protection to the solar cell.

Figure 15A:
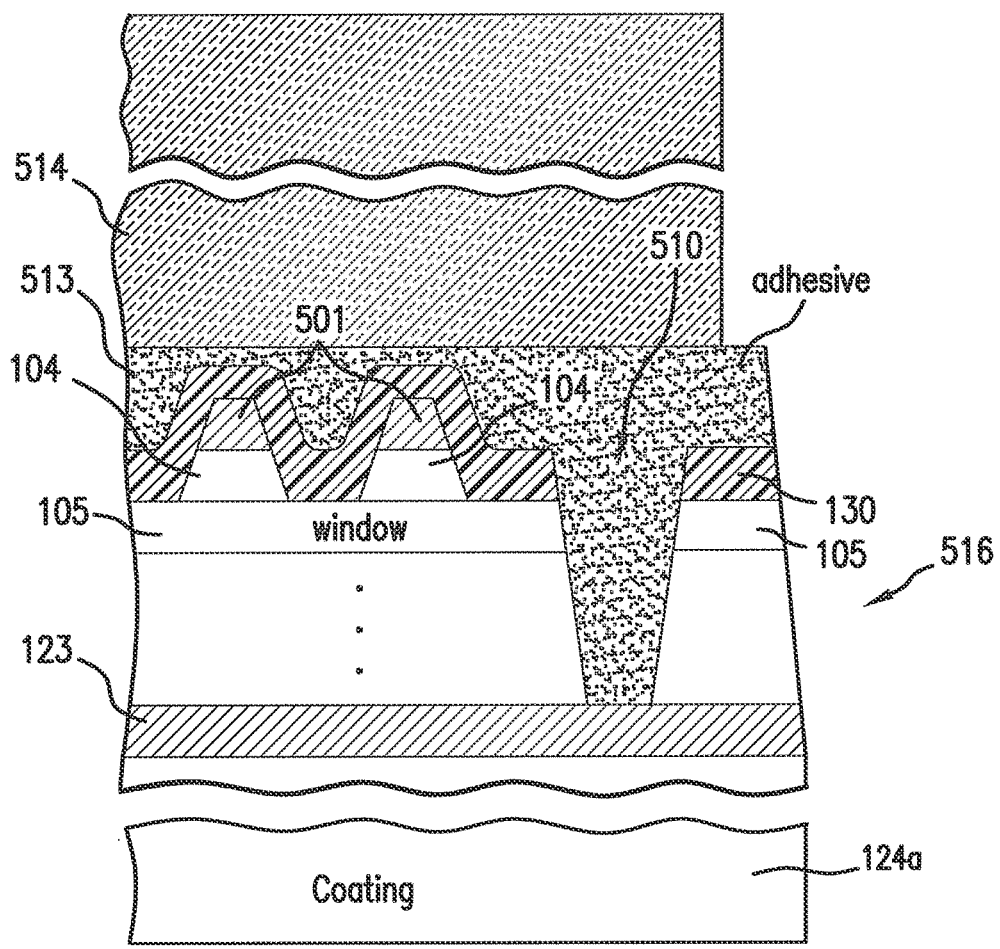
FIG. 15A is a cross-sectional view of the solar cell of FIG. 14B after the next process step in a third embodiment of the present invention.

FIG. 15A is a cross-sectional view of the solar cell of FIG. 14B after the next process step in some embodiments of the present invention in which the adhesive layer 124b, the surrogate substrate 125 and the peripheral portion 517 of the wafer is entirely removed, leaving only the solar cell with the cover glass 514 (or other layers or structures) on the top, and the coating layer 124a on the bottom. The surrogate substrate is preferably removed by the use of a 'Wafer Bond' solvent. As noted above, the surrogate substrate includes perforations over its surface that allow the flow of solvent through the surrogate substrate 125 to permit its lift-off. After lift-off, the surrogate substrate may be reused in subsequent wafer processing operations.

Figure 15B:
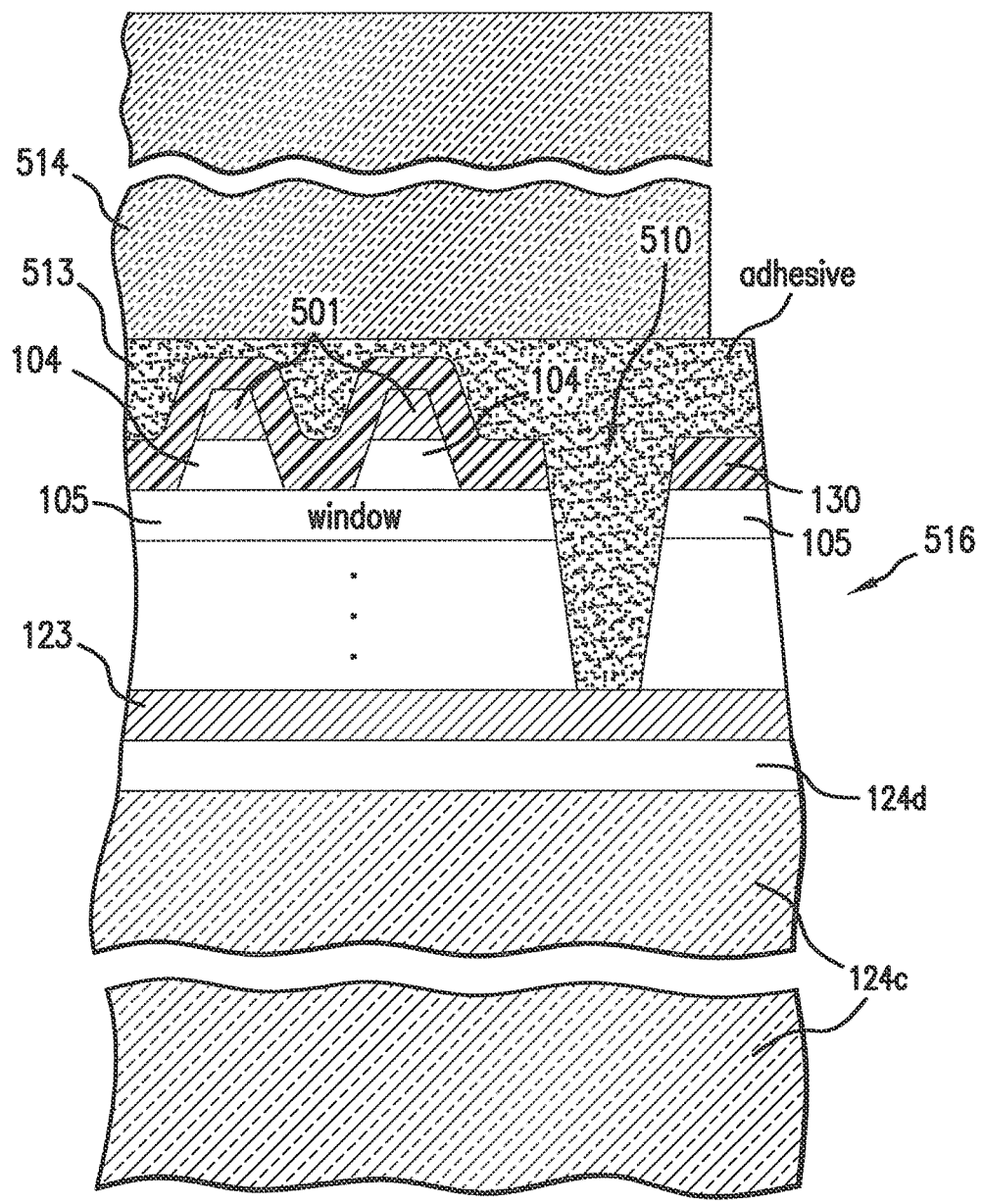
FIG. 15B is a cross-sectional view of the solar cell of FIG. 14E after the next process step in a sixth embodiment of the present invention.

FIG. 15B is a cross-sectional view of the solar cell of FIG. 14E after the next process step in some embodiments of the present invention in which the peripheral portion 517 of the wafer is entirely removed, leaving only the solar cell with the cover glass 514 (or other layers or structures) on the top, and the glass surrogate substrate 124c on the bottom.

Figure 16:
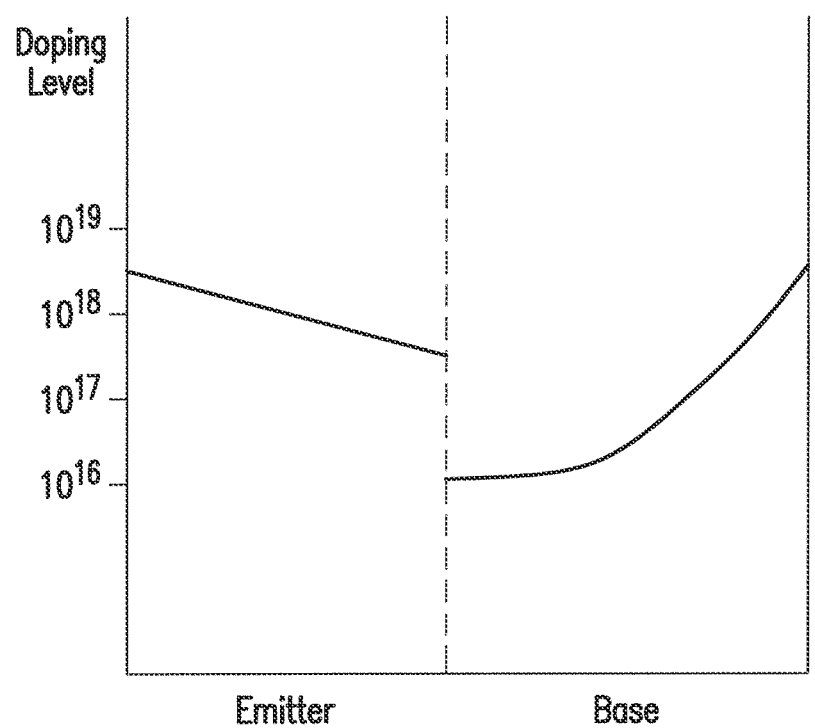
FIG. 16 is a graph of the doping profile in the base and emitter layers of a subcell in the metamorphic solar cell according to the present invention.

FIG. 16 is a graph of a doping profile in the emitter and base layers in one or more subcells of the inverted metamorphic multi junction solar cell of the present invention. The various doping profiles within the scope of the present invention, and the advantages of such doping profiles are more particularly described in copending U.S. Patent Application Pub. No. 2009/0155952 A1 (Stan et al.), herein incorporated by reference. The doping profiles depicted herein are merely illustrative, and other more complex profiles may be utilized as would be apparent to those skilled in the art without departing from the scope of the present invention.

Figure 17:
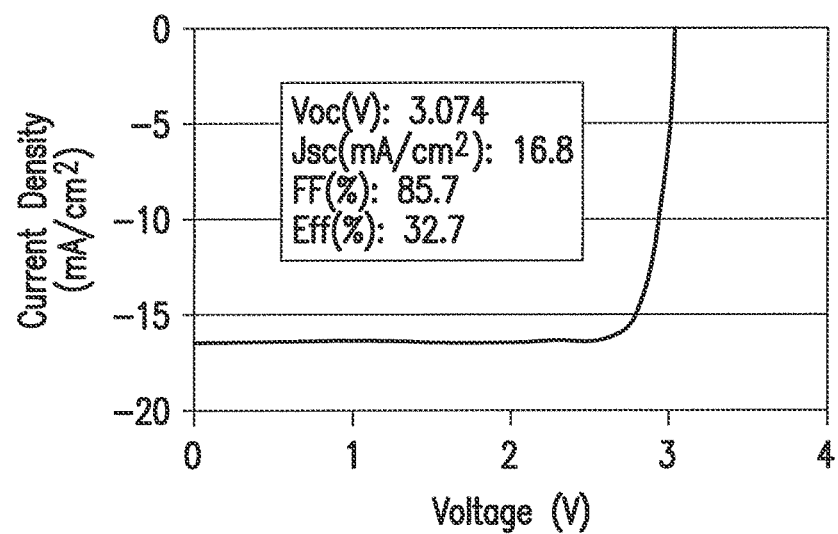
FIG. 17 is a graph that depicts the current and voltage characteristics of an inverted metamorphic multijunction solar cell according to the present invention.

FIG. 17 is a graph that depicts the current and voltage characteristics of the solar cell according to the present invention. The solar cell has an open circuit voltage ($V_{oc}$) of approximately 3.074 volts, a short circuit current of approximately 16.8 mA/cm$^2$, a fill factor of approximately 85.7%, and an efficiency (at AM0) of 32.7%.

Figure 18:
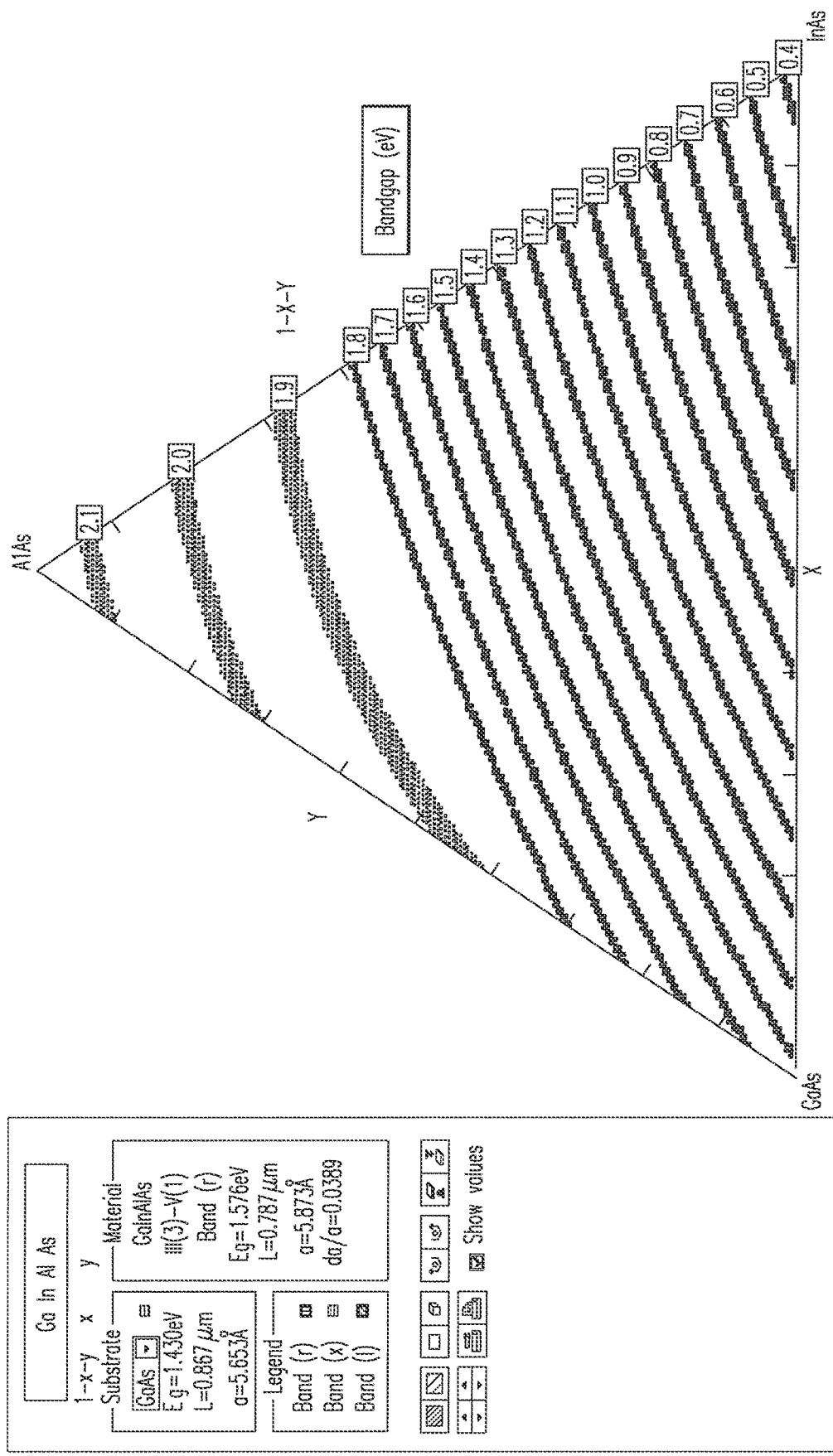
FIG. 18 is a diagram representing the range of band gaps of various GaInAlAs materials as a function of the relative concentration of Al, In, and Ga.

FIG. 18 is a diagram representing the range of band gaps of various GaInAlAs materials as a function of the relative concentration of Al, In, and Ga. This diagram illustrates how the selection of a constant band gap sequence of layers of GaInAlAs used in the metamorphic layer may be designed through the appropriate selection of the relative concentration of Al, In, and Ga to meet the different lattice constant requirements for each successive layer. Thus, whether 1.5 eV or 1.1 eV or other band gap value is the desired constant band gap, the diagram illustrates a continuous curve for each band gap, representing the incremental changes in constituent proportions as the lattice constant changes, in order for the layer to have the required band gap and lattice constant.

Figure 19:
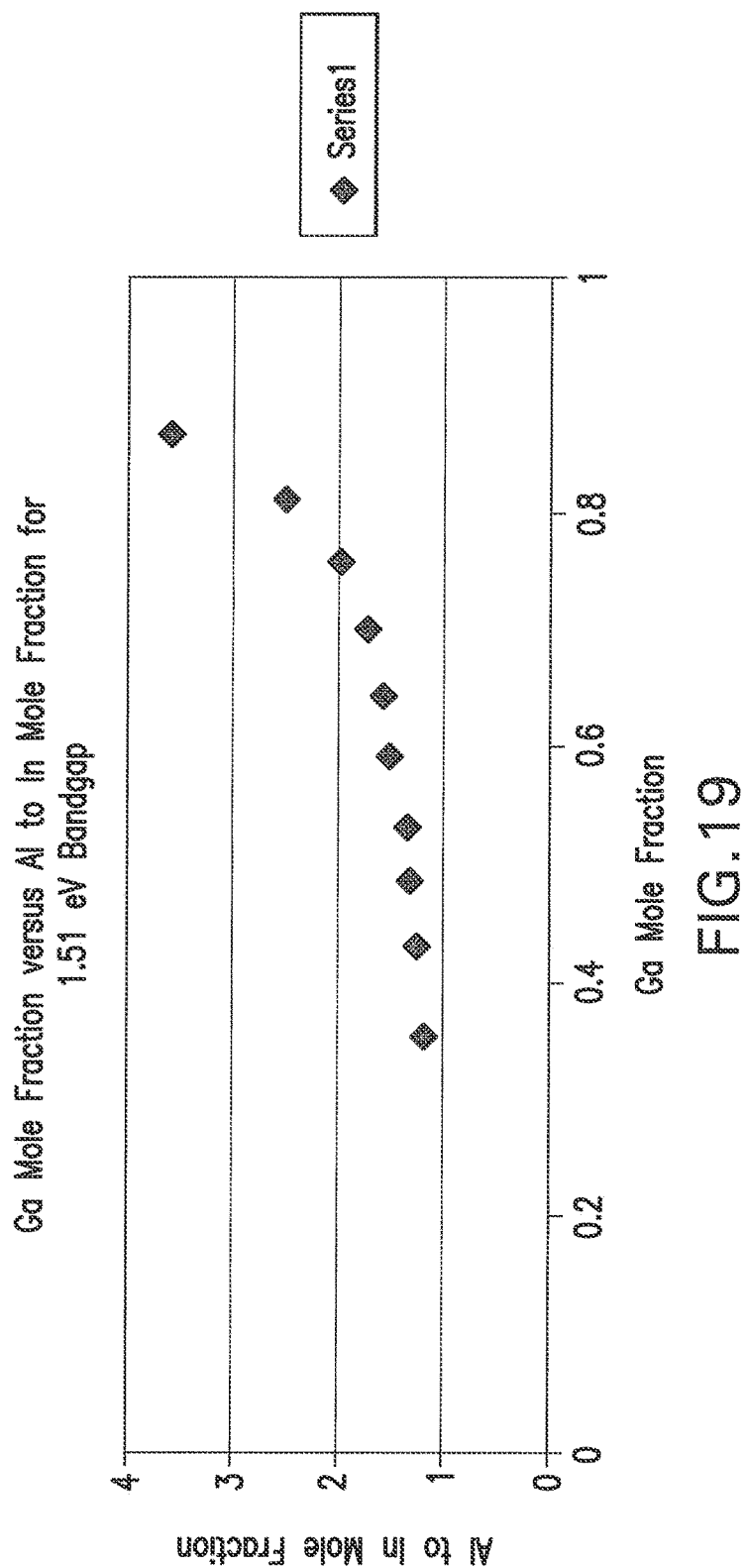
FIG. 19 is a graph representing the Ga mole fraction versus the Al to In mole fraction in GaInAlAs materials that is necessary to achieve a constant 1.5 eV band gap.

FIG. 19 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.5 eV band gap.

Figure 20:
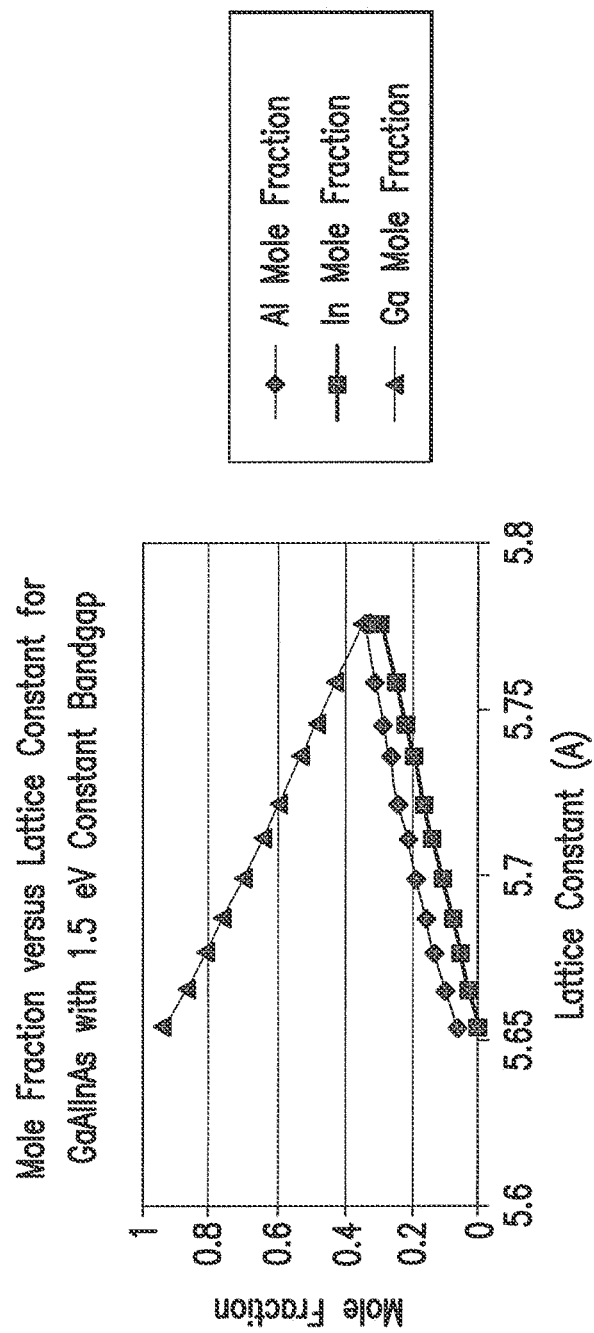
FIG. 20 is a graph representing the mole fraction versus lattice constant in GaInAlAs materials that is necessary to achieve a constant 1.5 eV band gap.

FIG. 20 is a graph that further illustrates the selection of a constant band gap sequence of layers of GaInAlAs used in the metamorphic layer by representing the mole fraction versus lattice constant in GaInAlAs materials that is necessary to achieve a constant 1.5 eV band gap.

It will be understood that each of the elements described above, or two or more together, also may find a useful application in other types of constructions differing from the types of constructions described above.

Although one embodiment of the present invention utilizes a vertical stack of three subcells, the present invention can apply to stacks with fewer or greater number of subcells, i.e. two junction cells, four junction cells, five junction cells, etc. as more particularly described in U.S. Patent Application Pub. No. 2010/0116327 A1 (Cornfeld). In the case of four or more junction cells, the use of more than one metamorphic grading interlayer may also be utilized, as more particularly described in U.S. Patent Application Pub. No. 2010/0122724 A1 (Cornfeld et al.).

In addition, although the present embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multi junction cell, notwithstanding that the photogenerated current densities are typically different in the various subcells.

As noted above, the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. Patent Application Pub. No. 2009/0078310 A1 (Stan et al.), the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness. Some such configurations are more particularly described in copending U.S. Patent Application Pub. No. 2009/0272438 A1 (Cornfeld).

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in an inverted metamorphic multi junction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A method of manufacturing a solar cell comprising:
providing a semiconductor growth substrate;
depositing on said growth substrate a sequence of layers of semiconductor material forming a solar cell, including a first solar subcell deposited on said substrate having a first band gap; a second solar subcell deposited over said first subcell having a second band gap smaller than said first band gap; a grading interlayer deposited over said second subcell composed of InGaAlAs and having a third band gap larger than said second band gap; a third solar subcell deposited over the grading interlayer and having a fourth band gap smaller than said second band gap such that said third subcell is lattice mismatched with respect to said second subcell;
depositing a metal contact layer over said sequence of layers;

depositing a coating layer over the metal contact layer;
providing a permanent support substrate;
bonding an adhesive polymer layer to one surface of the permanent support substrate at a curing temperature above 350° C.;
affixing the cured adhesive surface of a permanent supporting substrate directly over said metal contact layer;
permanently bonding the supporting substrate to the metal contact layer by a thermocompressive technique; and
removing the growth substrate.

2. A method as defined in claim 1, wherein the coating layer is composed of a polymer, a polyimide composition, or an epoxy based photoresist material over the metal layer by spinning-on, spraying, or brushing.

3. A method as defined in claim 1, wherein the coating layer has a thickness of 20 to 25 microns.

4. A method as defined in claim 1, further comprising curing the coating layer.

5. A method as defined in claim 4, wherein the curing is performed by a soft bake, near UV exposure (350-400 nm), followed by post exposure bake at an annealing temperature of 205 degrees C. so that the coating layer is inert to subsequent chemical and thermal fabrication steps.

6. A method as defined in claim 1, further comprising depositing a bonding layer over the coating layer.

7. A method as defined in claim 1, wherein the metal contact layer is comprises a sequence of metal layers Ti/Au/Ag/Au or Ti/Pd/Ag.

8. A method as defined in claim 1, wherein the metal contact layer is specularly reflective over the wavelength range of incoming light.

9. A method as defined in claim 1, wherein the grading interlayer is composed of In Ga Al As.

10. A method as defined in claim 1, wherein the curing temperature is above 350° C.

11. A method as defined in claim 1, wherein the step of permanently bonding the permanent supporting substrate to the metal contact layer is performed by a thermocompressive technique.

12. A method as defined in claim 1, wherein the thermocompressive technique utilizes a press for directly applying pressure and heat.

13. A method as defined in claim 1, wherein the permanent supporting substrate is a glass substrate.

14. A method as defined in claim 1, wherein the semiconductor growth substrate is removed by at least one of grinding, etching, or epitaxial lift-off.

15. A method as defined in claim 1, further comprising forming grid electrodes on an exposed surface of the layers of semiconductor material after removal of the semiconductor growth substrate to form a top or light-incident surface of the solar cell.

16. A method as defined in claim 5, further comprising attaching a cover glass over the grid electrodes.

* * * * *